United States Patent
Catthoor et al.

(10) Patent No.: US 12,374,392 B2
(45) Date of Patent: Jul. 29, 2025

(54) 3D INTEGRATED CIRCUIT

(71) Applicants: IMEC VZW, Leuven (BE); Katholieke Universiteit Leuven, Leuven (BE)

(72) Inventors: Francky Catthoor, Temse (BE); Dawit Burusie Abdi, Leuven (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 157 days.

(21) Appl. No.: 18/482,263

(22) Filed: Oct. 6, 2023

(65) Prior Publication Data
US 2024/0119998 A1    Apr. 11, 2024

(30) Foreign Application Priority Data
Oct. 7, 2022   (EP) ..................................... 22200294

(51) Int. Cl.
| | |
|---|---|
| *G11C 11/419* | (2006.01) |
| *G11C 5/06* | (2006.01) |
| *H01L 25/065* | (2023.01) |
| *H10B 10/00* | (2023.01) |
| *H10B 80/00* | (2023.01) |

(52) U.S. Cl.
CPC ............ *G11C 11/419* (2013.01); *G11C 5/063* (2013.01); *H01L 25/0657* (2013.01);
(Continued)

(58) Field of Classification Search
CPC ....... G11C 11/419; G11C 5/063; G11C 5/025; G11C 7/18; G11C 7/065; G11C 7/067;
(Continued)

(56) References Cited

U.S. PATENT DOCUMENTS

2009/0045489 A1*   2/2009   Koon ................ H01L 23/49527
                                                           438/109
2015/0130068 A1   5/2015   Lin et al.
(Continued)

OTHER PUBLICATIONS

Extended European Search Report and Written Opinion, Application No. EP 22200294.1, mailed Mar. 6, 2023, 8 pages.
(Continued)

*Primary Examiner* — Fernando Hidalgo
(74) *Attorney, Agent, or Firm* — McDonnell Boehnen Hulbert & Berghoff LLP

(57) ABSTRACT

The disclosed 3D IC includes a plurality of vertically stacked device tiers, each device tier comprising an SRAM circuit, each SRAM circuit comprising an SRAM bit cell, wherein the bit cells are stacked on top of each other to define a stack of bit cells and wherein and each bit cell comprises first and second pass transistors, first pull-up and pull-down transistors, and second pull-up and pull-down transistors. The SRAM circuits have an identical layout and each SRAM circuit comprises: a single active layer forming an active semiconductor pattern of the transistors of the bit cell, and a single routing layer of horizontally routed conductive lines comprising a complementary pair of first and second bit lines connected to the bit cell of the SRAM circuit, gate lines defining gates of the transistors of the bit cell of the SRAM circuit, and wiring lines forming interconnections of the bit cell of the SRAM circuit.

19 Claims, 18 Drawing Sheets

(52) U.S. Cl.
CPC ............ H10B 10/125 (2023.02); H10B 80/00 (2023.02); *H01L 2225/06506* (2013.01)

(58) Field of Classification Search
CPC ... G11C 7/1096; G11C 11/41; H01L 25/0657; H01L 2225/06506; H01L 2225/06541; H10B 10/125; H10B 80/00; H10B 10/12; H10B 10/18; H10D 89/10; H10D 88/00
USPC .................................................. 365/189.011
See application file for complete search history.

(56) References Cited

U.S. PATENT DOCUMENTS

| | | | |
|---|---|---|---|
| 2018/0174644 A1* | 6/2018 | Sakhare | .............. G11C 11/1675 |
| 2022/0109447 A1 | 4/2022 | Catthoor et al. | |
| 2024/0040762 A1* | 2/2024 | Liaw | .................... H10B 10/125 |

OTHER PUBLICATIONS

Giacomin, Edouard, Juergen Boemmels, Julien Ryckaert, Francky Catthoor, and Pierre-Emmanuel Gaillardon. "Layout considerations of logic designs using an n-layer 3D nanofabric process flow." In 2020 IFIP/IEEE 28th International Conference on Very Large Scale Integration (VLSI-SOC), pp. 34-39. IEEE, 2020.

Gaillardon, Pierre-Emmanuel, Luca Gaetano Amarù, Shashikanth Bobba, Michele De Marchi, Davide Sacchetto, and Giovanni De Micheli. "Nanowire systems: Technology and design." Philosophical Transactions of the Royal Society A: Mathematical, Physical and Engineering Sciences 372, No. 2012 (2014): 20130102.

Macha, Naveen Kumar, Md Arif Iqbal, and Mostafizur Rahman. "New 3-D CMOS fabric with stacked horizontal nanowires." IEEE Transactions on Computer-Aided Design of Integrated Circuits and Systems 38, No. 9 (2018): 1625-1634.

Guler, Abdullah, and Niraj K. Jha. "Hybrid monolithic 3-D IC floorplanner." IEEE Transactions on Very Large Scale Integration (VLSI) Systems 26, No. 10 (2018): 1868-1880.

Rahman, Mostafizur, Santosh Khasanvis, Jiajun Shi, Mingyu Li, and Csaba Andras Moritz. "Skybridge: 3-D integrated circuit technology alternative to CMOS." arXiv preprint arXiv:1404.0607 (2014).

Leibson, Steve. '3D Week: Wide I/O SDRAM, Network on Chip, Multicore, TSV, Asynchronous Logic—3D SoC stack from CEA-Leti and ST-Ericsson hits all the advanced notes. Can you say "Tour de Force"?' The Way Forward for Electronic Design, EDA360 Insider, published Dec. 14, 2011, 5 pages.

* cited by examiner

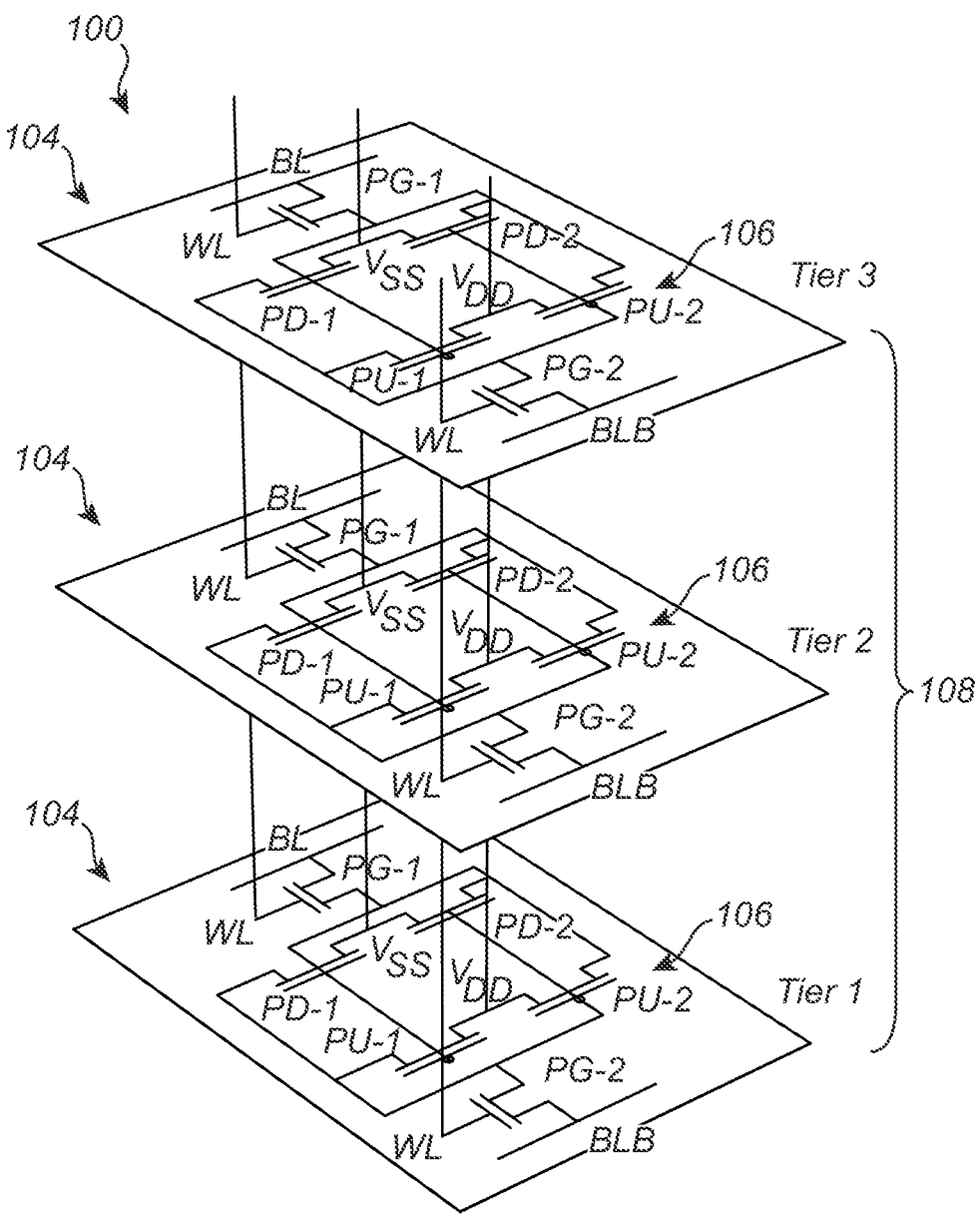
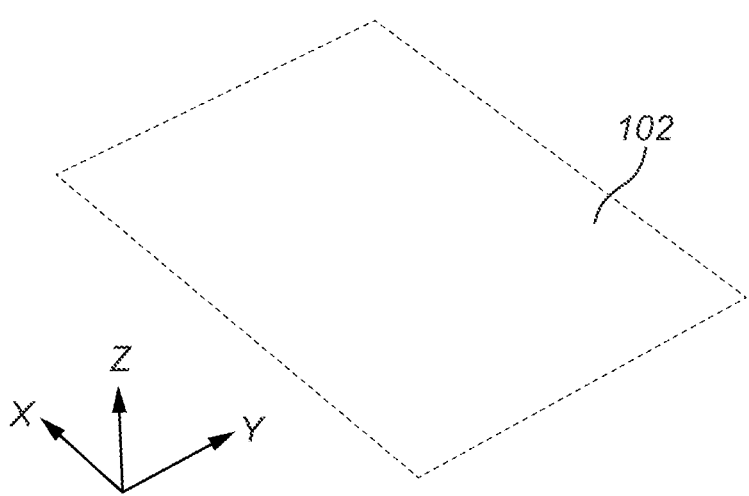
Fig. 3

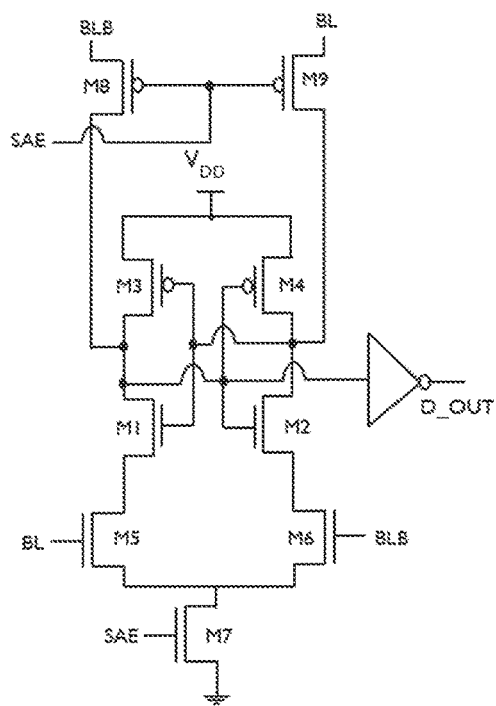 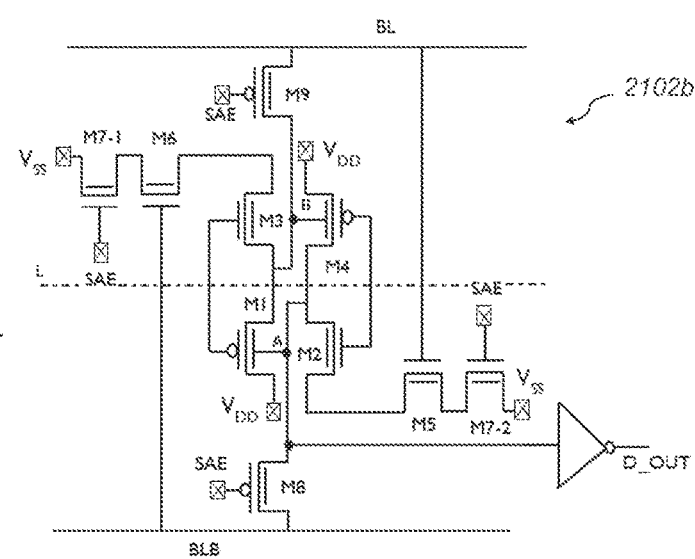
Fig. 9a                    Fig. 9b

3D INTEGRATED CIRCUIT

CROSS-REFERENCE TO RELATED APPLICATIONS

The present application is a non-provisional patent application claiming priority to European Patent Application No. EP 22200294.1, filed Oct. 7, 2022, the contents of which are hereby incorporated by reference.

FIELD OF THE DISCLOSURE

The present disclosure relates to a 3D IC comprising a stack of SRAM circuits.

BACKGROUND

The semiconductor industry has constantly been scaling down the device dimensions to continually achieve high density, high performance, and power efficient integrated circuits (ICs). However, this conventional two-dimensional device scaling is saturating due to physical, technological, and economic limitations. To break through these limits, integration technologies that exploit the third dimension to form ICs chips are being actively explored. Exploiting the third dimension can result in high density 3D ICs without requiring costly feature size reduction.

According to a conventional integration process for 3D IC fabrication, known as "parallel 3D" or "chip-stacking", separately processed wafers or dies may be stacked and interconnected by Through Silicon Vias (TSVs). According to an alternative approach, known as "sequential 3D integration", wafers or dies may be bonded and processed sequentially, and interconnected by conventional vias. Parallel 3D allows stacking of several circuits. However, the relatively large footprint of TSVs limit the interconnection density and conversely results in a significant area overhead. On the other hand, sequential 3D enables smaller vertical interconnect pitches. However, the number of stacked vertical tiers in sequential 3D is limited by the cost and complexity of the manufacturing process. To this date, state-of-the-art sequential 3D works typically employ only 2 to 4 stacked active tiers.

More recently, a novel design concept for a 3D IC has been proposed by [1] Edouard Giacomin et al ("Layout Considerations of Basic Arithmetic Logic Units Using an N-layer 3D Nanofabric Process Flow", 28th IFIP WG 10.5/IEEE International Conference on Very Large Scale Integration (VLSI-SoC), 2020, pp. 34-39). The design is based on multiple stacked device tiers with identical layout and a single metal routing layer for each tier. This design enables a process flow where multiple stacked layers can be patterned at once with a few constant critical lithography steps regardless of the number of stacked layers, thereby, decreasing the manufacturing costs substantially, in a fashion reminiscent to the 3D NAND flash process.

While a significant area and cost reduction can be achieved using the "3D Nanofabric" technology, it presents two physical design constraints in processing all the stacks of layers at once. These are: (i) the layout of each device tier must be such that all crossings between metal lines in the routing layer are avoided, except for gate lines over the channel area (the "no-crossing" rule); and (ii) all the tiers must have identical layouts and hence, perform the same logic operations.

Static Random Access Memory (SRAM) is a widely used memory technology, used e.g. in embedded systems and modern computing devices. As an illustrative example, in modern microprocessors, the on-chip SRAM caches consume about half of the total chip area, 60%-90% of the transistor counts and large percentage of power budget. Hence, implementing on chip SRAM caches in a 3D IC promise reduced total chip area and enhanced chip performance.

SUMMARY

The present disclosure provides a 3D IC comprising a stack of SRAM bit cells and having a design compatible with the 3D Nanofabric design.

In one example embodiment a 3D IC is provided. The 3D IC includes a plurality of vertically stacked device tiers, each device tier comprising an SRAM circuit, each SRAM circuit comprising an SRAM bit cell, wherein the bit cells are stacked on top of each other to define a stack of bit cells and wherein and each bit cell comprises first and second pass transistors, first pull-up and pull-down transistors, and second pull-up and pull-down transistors. The SRAM circuits have an identical layout and each SRAM circuit comprises: a single active layer forming an active semiconductor pattern of the transistors of the bit cell, and a single routing layer of horizontally routed conductive lines comprising a complementary pair of first and second bit lines connected to the bit cell of the SRAM circuit, gate lines defining gates of the transistors of the bit cell of the SRAM circuit, and wiring lines forming interconnections of the bit cell of the SRAM circuit. The 3D IC further includes pull-up and pull-down voltage rails routed vertically through the stack of bit cells and connected to each bit cell of the stack; and first and second word lines routed vertically through the stack of bit cells and connected to each bit cell of the stack of bit cells.

The disclosed 3D IC may be based on the realization that the 3D Nanofabric design constraints of a single routing layer and an identical circuit layout may be met by: (i) routing the bit lines (BLs) and the interconnections between the transistors of the bit cell horizontally in the single routing layer, and (ii) routing of the pull-up (PU) and pull-down (PD) supply rails (e.g. VDD and VSS) and the word lines (WL) vertically through the stack of bit cells and thus be shared across all the bit cells of the stack. This allows for an area-efficient memory design which may be realized in a rational and cost-effective manner.

The first pull-up and pull-down transistors may be denoted a first inverter pair while the second pull-up and pull-down transistors may be denoted a second inverter pair. In accordance with SRAM technology, the first and second inverter may be cross-coupled to each other by the single routing layer. That is, the input of the first inverter pair (i.e. the gates of the first pull-up and pull-down transistors) may be connected to the output of the second inverter pair (e.g. the interconnected source/drain regions of the second pull-up and pull-down transistors), and vice versa.

As used herein, the term "device tier" refers to the respective (vertical) tiers or levels of the 3D IC.

As used herein, the term "vertical" refers to an orientation or direction perpendicular to a main plane of extension of any one of the device tiers, i.e. parallel to the stacking direction of the bit cells/device tiers (e.g. bottom-up or top-down). "Vertical" may also be understood as a normal direction to a main plane of extension of a substrate of the 3D IC. Conversely, the term "horizontal" refers to an orientation or direction parallel to a main plane of extension of any one of the device tiers (or a substrate of the 3D IC).

Thus, "horizontal" and "vertical" are orientations/directions relative to the 3D IC and do not refer to absolute spatial orientations/directions.

As used herein, the term "layout" (e.g. with respect to an SRAM circuit, a bit cell or other circuitry) refers to the layout of the active semiconductor pattern and the horizontally routed conductive lines of the single layer of a respective circuit (e.g. SRAM circuit). The layout thus refers to the location and orientation of each semiconductor pattern portion of the single active layer, and the extension of each horizontally routed conductive line of the circuit. Accordingly, it follows that two circuits with identical layout have identical netlists.

As used herein, the wording "the SRAM circuits have an identical layout" means that a layout of each SRAM circuit is identical among the SRAM circuits of the stacked device tiers. Hence, each SRAM circuit has, i.e. is arranged according to, a same layout. This applies to the active semiconductor pattern of the single active layer as well as to the conductive lines of the single routing layer.

Accordingly, each bit cell of any one of the SRAM circuits has a corresponding bit cell (with identical layout) in each other bit cell of the stack, wherein the corresponding bit cells overlay or overlap each other. Correspondingly, any transistor of any one of the bit cells of the stack has a corresponding transistor in each other bit cell of the stack, wherein the corresponding transistors overlay or overlap each other. Similarly, each conductive line of any one of the bit cells of the stack has a corresponding conductive line in each other bit cell of the stack, wherein the corresponding conductive lines overlay or overlap each other.

As used herein, the term "single active layer" refers to a pattern of active semiconductor structures (e.g. comprising channel regions and source/drain regions of the transistors) arranged in a common horizontal plane of a respective bit cell.

As used herein, the term "single routing layer of horizontally routed conductive lines" refers to a set of conductive lines extending in a common horizontal plane. As may be appreciated the common horizontal plane associated with the active semiconductor pattern of an SRAM circuit may be offset and parallel to the horizontal plane associated with the single routing layer of the SRAM circuit. The single routing layer of a respective SRAM circuit may be arranged on top of the single active layer of the SRAM circuit.

The single routing layer (and correspondingly the conductive lines thereof) may be arranged according to the "no-crossing" design rule of the 3D Nanofabric. Thus, in accordance with the no-crossing rule, within the respective single routing layer of each SRAM circuit, no conductive line (bit line, gate line or wiring line) of the respective single routing layer extends across any other conductive line (bit line, gate line or wiring line) of the respective layer.

As used herein, a "crossing" or an extension "across", in relation to a first and second conductive line of a single routing layer, means that the first conductive line extends to, through, and past the second conductive line. There is hence a (non-zero) intersection (i.e. a common volume) of the first and second structure at the crossing between the first and second conductive lines. Conversely, the "no-crossing" rule means that no conductive line of a single routing layer extends to, through, and past any other conductive line of the routing layer.

On the other hand, the "no-crossing" rule need not be enforced between a structure of a first layer and a structure of a second layer (e.g. a gate line of a single routing layer and a channel portion of a single active layer). For example, a gate line of a single routing layer on top of a single active layer may cross/extend across a channel region of the single active layer, e.g. by extending to, over, and past the channel region (thus overlapping but not intersecting the channel region).

In some embodiments, the first pull-down transistor and the second pull-down transistor of each bit cell of the stack may be connected to a same pull-down voltage rail and the first pull-up transistor and the second pull-up transistor of each bit cell of the stack may be connected to a same pull-up voltage rail. A single pair of pull-up and pull-down voltage rails may hence be shared by the first and second inverter pairs. This may reduce the complexity and cost of the fabrication by limiting the number of vertically routed connections through the stack. Additionally, this may facilitate an area efficient bit cell by limiting the horizontal footprint of vertical connections (vias) in the SRAM circuits.

In some embodiments, the single routing layer may comprise first and second gate lines extending in parallel in a horizontal first cell direction and spaced apart in a horizontal second cell direction transverse to the first cell direction, the first gate line overlapping respective channel regions of the first pull-down and pull-up transistors, and the second gate line overlapping respective channel regions of the second pull-down and pull-up transistors, wherein the pull-down voltage rail may be connected to respective first source/drain regions of the first and second pull-down transistors located between the first and second gate lines, and wherein the pull-up voltage rail may be connected to respective first source/drain regions of the first and second pull-up transistors located between the first and second gate lines.

This facilitates an area efficient implementation of a bit cell with shared pull-down and pull-up voltage rails. As the pull-up and pull-down voltage rails connections may be provided between i.e. inside the gate lines, space is created on the respective outsides of the gate lines for cross-coupling the inverter pairs by the horizontal routing resources of the single routing layer. The first and second gate lines may define gates of the first inverter pair and the second inverter pair respectively. The need for separate gate structures for each inverter pair and additional horizontal routing sources for a gate-to-gate connection of the respective inverter pairs may thus be obviated. It is to be noted that the configuration of parallel first and second gate lines may be used also in embodiments of bit cells not comprising shared pull-down and pull-up voltage rails.

In some embodiments, the single routing layer may comprise first and second wiring lines parallel to and arranged between the first and second gate lines, wherein the pull-down voltage rail is connected to the respective first source/drain regions of the first and second pull-down transistors by the first wiring line, and wherein the pull-up voltage rail is connected to the respective first source/drain regions of the first and second pull-up transistors by the second wiring line.

The pull-up voltage rail and the pull-down voltage rail may hence be connected to the respective first source/drain regions by a respective single wiring line of the single routing layer. The first wiring line may in particular be arranged to overlap and abut the first source/drain regions of the first and second pull-down transistors. The second wiring line may correspondingly be arranged to overlap and abut the first source/drain regions of the first and second pull-up transistors.

In some embodiments, the first and second pull-down transistors may be arranged directly opposite each other along the first wiring line, and the first and second pull-up transistors are arranged directly opposite each other along the second wiring line. The pull-up transistors on the one hand, and the pull-down transistors on the other hand, may thus be respectively aligned with each other (e.g. as seen in the second cell direction). The combined foot print of the two inverter pairs along the first cell direction may hence be minimized.

In some embodiments, the single routing layer of each bit cell may further comprise:
a third wiring line parallel to the first gate line and interconnecting respective second source/drain portions of the first pull-down and pull-up transistors,
a fourth wiring line extending in the second cell direction and interconnecting the third wiring line and the second gate line,
a fifth wiring line parallel to the second gate line and interconnecting respective second source/drain portions of the second pull-down and pull-up transistors, and
a sixth wiring line extending in the second cell direction and interconnecting the fifth wiring line and the first gate line.

The third and fourth wiring lines may hence define a substantially L-shaped connection between the second source/drains of the first inverter pair and the second gate line. Correspondingly, the fifth and sixth wiring lines may hence define a substantially L-shaped connection between the second source/drains of the second inverter pair and the first gate line. These L-shaped connections are enabled by connections to the pull-down and pull-up voltage rails on the inside of the first and second gate lines.

In some embodiments, the first gate line may extend in the first cell direction between a first end portion and a second end portion, and the second gate line may extend in the first cell direction between a first end portion and a second end portion, and wherein the fourth wiring line may extend between the third wiring line and the second end portion of the second gate line, past and at a distance from the second end portion of the first gate line, and the sixth wiring line may extend between the fifth wiring line and the first end portion of the first gate line, past and at a distance from the first end portion of the second gate line. This further facilitates the cross-coupling within the single routing layer since the fourth and sixth wiring lines may be arranged on mutually opposite sides of the first and second gate lines, as seen along the first cell direction.

In some embodiments, the first and second pass transistors may each comprise first and second source/drain regions, and a channel region extending in the first cell direction between the first and second source/drain regions. The first source/drain region of the first pass transistor may be connected to the first bit line, and the second source/drain region of the first pass transistor is connected to the fourth wiring line. The first source/drain region of the second pass transistor may be connected to the second bit line, and the second source/drain region of the second pass transistor is connected to the sixth wiring line. The single routing layer may further comprise third and fourth gate lines extending in the second cell direction, the third gate line overlapping the channel region of the first pass transistor, and the fourth gate line overlapping the channel region of the second pass transistor. The complementary storage nodes defined by the two inverter pairs may hence be connected to the complementary pair of first and second bit lines via the first and second pass transistors without any additional horizontal routing resources.

In some embodiments, the pair of first and second bit lines of each SRAM circuit may extend in parallel along mutually opposite sides of the bit cell of the SRAM circuit. The bit lines may for instance extend in the aforementioned second cell direction.

In some embodiments, each SRAM circuit may comprise an array of SRAM bit cells arranged in a number of rows and a number of columns, wherein the arrays of bit cells are stacked on top of each other to define an array of stacks of bit cells of the 3D IC. The single routing layer of each SRAM circuit may comprise, for each column of bit cells of the array of bit cells of the SRAM circuit, a complementary pair of first and second bit lines connected to each bit cell of the column of bit cells, and, for each bit cell of the array of bit cells, gates of transistors of the bit cell, and wiring lines forming interconnections of the bit cell. The 3D IC may further comprise, for each stack of bit cells of the array of stacks of bit cells, pull-up and pull-down voltage rails and first and second word lines routed vertically through the stack of bit cells and connected to each bit cell of the stack of bit cells.

An array of stacks of SRAM bit cells compatible with the 3D Nanofabric design constraints may hence be realized. As may be appreciated, the bit cells, bit lines, pull-up and pull-down voltage rails and word lines discussed in connection with the preceding embodiments, may be comprised in the corresponding sets of structures of the embodiments of the 3D IC comprising the array of stacks of SRAM bit cells. Conversely, the details and embodiments discussed above, may be applied correspondingly to each of the bit cells of the array of bit cells.

In some embodiments, each SRAM circuit may further comprise, for each column of bit cells of the array of bit cells of the SRAM circuit, a respective supplementary circuit connected to the pair of first and second bit lines connected to the column of bit cells. Each respective supplementary circuit may comprise at least one of a pre-charge circuit, a sense amplifier, a write driver and a data latch (i.e. connected to the respective pair of first and second bit lines). The supplementary circuits of the SRAM circuits may be stacked on top of each other to define a stack of supplementary circuits for each column of stacks of bit cells. The 3D IC may further comprise, for each stack of supplementary circuits, a set of supply voltage rails and select lines routed vertically through the stack of supplementary circuits and connected to each peripheral circuit of the stack of supplementary circuits.

Supplementary circuits enabling operation of the arrays of SRAM bit cells may hence be included in the SRAM circuits, wherein it is to be understood that the supplementary circuits may be designed according to the Nanofabric design rules. Each supplementary circuit of an SRAM circuit may comprise a network of interconnected logic gates and each logic gate may comprise a network of interconnected transistors. Each supplementary circuit of a stack of supplementary circuits may have an identical layout. The single active layer of each SRAM circuit may form an active semiconductor pattern of the transistors of the logic gates of the supplementary circuits of the SRAM circuit. The single routing layer of each SRAM circuit may comprise gate lines defining gates of the transistors of the logic gates of the supplementary circuits, and wiring lines forming interconnections between the transistors and logic gates of the supplementary circuits. The network of logic gates of each supplementary circuit of each stack of supplementary circuits may be configured to implement at least one of a pre-charge circuit, a sense amplifier, a write driver and a data latch.

As used herein, the term "layout of the network of logic gates" refers to the horizontal layout of the network of logic gates of the circuit, i.e. the layout of the network of logic gates within a plane of the device tier comprising the circuit. That the layout of the circuits is identical has a corresponding meaning as set out with respect to the SRAM circuits above. Accordingly the identical layout of the circuits of a stack of circuits (e.g. supplementary, control or decoder circuits) means that the network of logic gates of each logic circuit has, i.e. is arranged according to, a same layout. Accordingly, each logic gate of a circuit of a stack of circuits has a corresponding logic gate in all other circuits of the stack of circuits, wherein the corresponding logic gates overlay or overlap each other. Correspondingly, each conductive line (gate line or wiring line) in a network of logic gates of a circuit (or in a network of transistors of a logic gate of the circuit) have a corresponding conductive line (gate line or wiring line) in the network of logic gates of all other logic cells of the stack of logic cells (or in the network of transistors of the corresponding logic gate in all other circuits), wherein the corresponding interconnecting wires overlay or overlap each other.

In some embodiments, the stack of supplementary circuits for each column of stacks of bit cells may comprise a stack of sense amplifier circuits, wherein each sense amplifier circuit is connected to the pair of first and second bit lines connected to a respective column of bit cells, and
wherein the 3D IC may comprise, for each stack of sense amplifier circuits, first through fourth select lines (for enabling the sense amplifier circuit), first and second pull-up voltage rails and first and second pull-down voltage rails, each routed vertically through the stack of sense amplifier circuits and connected to each sense amplifier circuit of the stack of sense amplifier circuits.

Duplicating the pull-up and pull-down voltage rails, as well as the select lines (the conventional sense amplifier typically comprising only two), enables a circuit layout without the metal crossings found in conventional sense amplifier circuits such that the sense amplifier may be realized in accordance with the Nanofabric no-crossing rule. In particular, the vertical routing combined with the duplication of the select lines and pull-up and pull-down voltage rails enable horizontal routing options without metal crossings.

Each sense amplifier circuit may comprise a latch circuit comprising a first inverter pair (a first pull-up transistor and a first pull-down transistor) and a second inverter pair (a second pull-down transistor and second pull-up transistor), wherein the first and second inverter pairs are cross-coupled.

An output of the first inverter pair may be connected to the second bit line via a first select transistor enabled by the first select line. An output of the second inverter pair may be connected to the first bit line via a second select transistor enabled by the second select line.

The first pull-up transistor may be connected to the first pull-up voltage rail and the second pull-up transistor may be connected to the second pull-up voltage rail.

The first pull-down transistor may be connected to the first pull-down voltage rail via first and second current source transistors, wherein the first current source transistor is enabled by the third select line and the second current source transistor is enabled by the second bit line.

The second pull-down transistor may be connected to the second pull-down voltage rail via third and fourth current source transistors, wherein the third current source transistor is enabled by the fourth select line and the fourth current source transistor is enabled by the first bit line.

The transistors of the sense amplifier circuit may form part of a network of interconnected transistors arranged in a layout being centrally symmetric.

In some embodiments, each device tier may further comprise a control circuit, wherein the control circuits may be stacked on top of each other to define a stack of control circuits, and wherein each control circuit may comprise a network of interconnected logic gates for providing select signals, each logic gate comprising a network of interconnected transistors. The control circuits may have an identical layout and each control circuit may comprise: a single active layer forming an active semiconductor pattern of the transistors of the logic gates of the control circuit, and a single routing layer of horizontally routed conductive lines comprising gate lines defining gates of the transistors of the logic gates of the control circuit, and wiring lines forming interconnections between the transistors and logic gates of the control circuit. The 3D IC may further comprise: a routing layer stacked on top of the device tiers comprising the SRAM circuits and the control circuits and configured to connect a top-most control circuit of the stack of control circuits to the select lines routed through the stacks of supplementary circuits.

Selective activation of the supplementary circuits connected to each column of stacks of bit cells may hence be facilitated by the top-most control circuit of the stack of control circuits. Since each stack of supplementary circuits are connected to a common set of vertically routed select lines there is no need to provide interconnections between the control circuit and supplementary circuits of each device tier but suffices to provide an interconnection between the circuits of the top-most device tier. The control circuits of the lower device tiers may hence define dummy control circuits, e.g. be electrically inactive during use. While not being used during operation of the SRAM array, including a control circuit in each device tier however confers an advantage of facilitating fabrication. This since, also the stack of control circuits may be formed in accordance with the 3D Nanofabric and hence be fabricated in parallel to the stack of SRAM circuits, wherein it may be ensured that the two stacks are formed with matching heights (i.e. along the vertical direction).

In some embodiments, each device tier may further comprise a decoder circuit, wherein the decoder circuits may be stacked on top of each other to define a stack of decoder circuits, and wherein each decoder circuit may comprise a network of interconnected logic gates for providing select signals, each logic gate comprising a network of interconnected transistors. The decoder circuits may have an identical layout and each decoder circuit may comprise: a single active layer forming an active semiconductor pattern of the transistors of the logic gates of the control circuit, and a single routing layer of horizontally routed conductive lines comprising gate lines defining gates of the transistors of the logic gates of the control circuit, and wiring lines forming interconnections between the transistors and logic gates of the control circuit. The 3D IC may further comprise: a routing layer stacked on top of the device tiers comprising the SRAM circuits and the control circuits and configured to connect a top-most decoder circuit of the stack of decoder circuits to the word lines routed through the array of stacks of bit cells.

Selective activation of stacks of bit cells of the array may hence be facilitated by the top-most decoder circuit of the stack of decoder circuits. The discussion of the stack of control circuits applies correspondingly to the stack of decoder circuits. Accordingly, the circuits of the lower device tiers may hence define dummy decoder circuits, but still serve the purpose of facilitating fabrication.

In some embodiments, the routing layer may comprise a number of horizontally routed word lines matching a number of rows of stacks of bit cells of the array, wherein each word line may be connected to the word lines of the stacks of bit cells arranged along a same row.

In some embodiments, the 3D IC may further comprise a routing layer stacked on top of the device tiers comprising the SRAM circuits. The routing layer may comprise horizontally routed supply voltage rails connected to the pull-up and pull-down voltage rails vertically routed through the stacks of bit cells and the supply voltage rails vertically routed through the stacks of supplementary circuits.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIG. 3 schematically depicts a 3D IC comprising a plurality of SRAM circuits according to an embodiment.

FIGS. 9a and 9b show a circuit schematic of a conventional sense amplifier and a sense amplifier according to an embodiment, respectively.

DETAILED DESCRIPTION

Figure 1:
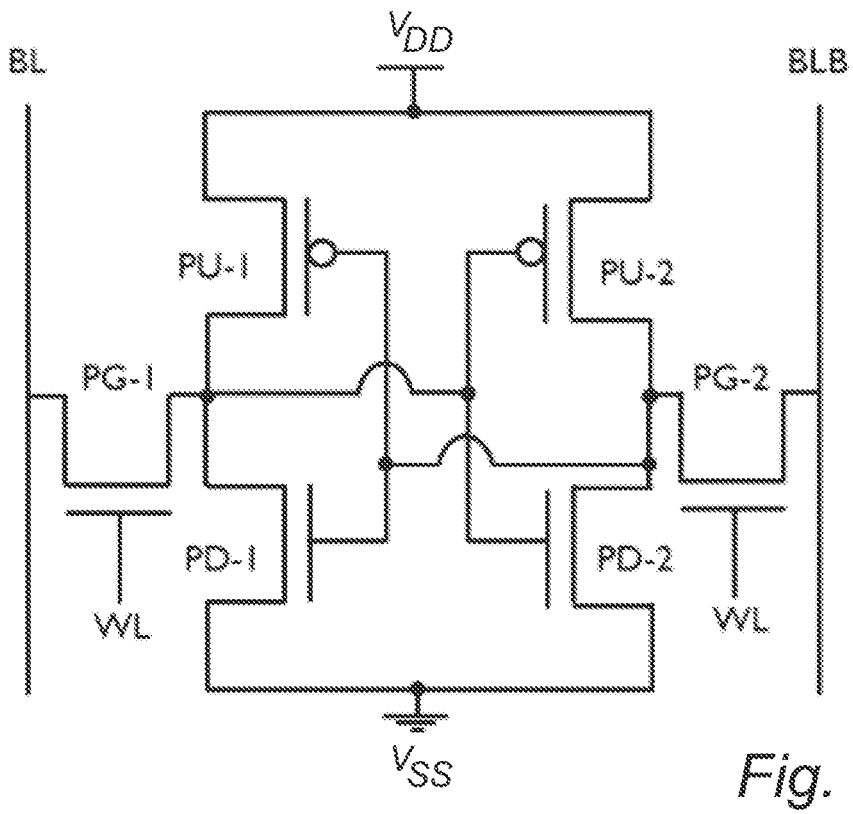
FIG. 1 depicts a conventional 6T SRAM bit cell.

The following disclosure pertains to a 3D IC comprising a plurality of vertically stacked device tiers, each device tier comprising an SRAM circuit, each SRAM circuit comprising a bit cell or an array of bit cells stacked vertically on top of each other. The stack of SRAM circuits may be formed in accordance with the 3D Nanofabric design as proposed by as proposed by Edouard Giacomin et al. One notable characteristic of the 3D Nanofabric is that whereas conventional 3D ICs may be fabricated by stacking separately processed wafers (as in parallel 3D integration) or sequentially stacking and processing wafers (as in sequential 3D integration), the 3D Nanofabric design enables a more rational process flow which may be scaled to greater number of device tiers. In particular, the SRAM circuits (as well as the control and decoder circuits) may be processed in parallel, e.g. "in a single shot", where all device tiers are processed simultaneously for any specific process step (e.g. etching or deposition with a given mask instance). This approach is in a sense reminiscent to a 3D NAND Flash integration flow. In particular, the 3D IC may be a monolithic 3D IC in the sense that the plurality of logic cells may be formed or arranged on a single common substrate of the 3D IC. A related advantage of the identical layouts of the SRAM circuits and the single routing layers thereof is that the device may be realized using a comparably small set of masks. In contrast, conventional 3D IC fabrication will require a different set of masks for each device tier. The identical layout of the network of logic gates of the logic cells, allows fabrication with a reduced set of masks.

An example fabrication process according to the parallel or "single shot" approach allowed by the 3D Nanofabric design will now be discussed with reference to FIGS. 11a-11f. In the figures, like fill patterns represent like elements unless stated otherwise. While the illustrated approach lends itself for a rational and cost-effective fabrication of a 3D IC, it is to be noted that it is also possible to form a 3D IC as set out herein using a conventional 3D sequential approach, wherein the identical layouts of the SRAM circuits still may facilitate rational and cost-effective fabrication using a reduced set of masks. Reference will in the following be made to logic cells, wherein it is to be understood that the term logic cell may refer to any one of an SRAM circuit, a supplementary circuit, a control circuit or a decoder circuit.

The processing starts by depositing a layer stack 200 on a substrate 201. The layer stack 200 comprises: for each logic cell of each device tier which is to be formed, a stack of an active semiconductor layer 202, a sacrificial layer 204 which will become the gate (dummy-Gate), and an inter-layer-dielectric 206. While there are multiple possible options for creating active layers, one option is to use layer transfer of crystalline silicon, as it is done for Silicon On Insulator (SOI) processes. Those SOI-like silicon devices are well understood and have good electrical characteristics. The sacrificial layer 204 may be a nitride-layer, such as silicon nitride, or some other material which may be etched with a sufficient selectivity with respect to the active layer and the inter-layer dielectric. The inter-layer 206 dielectric may be of a conventional inter-layer dielectric, such as silicon oxide.

The process relies on an indirect fabrication of gates, wherein the gates are formed in a "collateral" fashion. As shown in 11a, the layer stack 200 is patterned by forming cuts or trenches 210 by etching through the layer stack 200, e.g. at positions where source and drain regions will be formed. A high-aspect-ratio etch may be employed for this purpose, such as a reactive-ion etch or other suitable dry etching process. The cuts 210 may be formed by first forming a trench pattern in a hard mask 208 (e.g. using a litho-etch process) above the layer stack 200 and then etching the layer stack 200 through the trench pattern while using the hard mask 208 as an etch mask. As a result of the cuts 210, the stack of layers may be partitioned into a number of sub-stacks separated by trenches, which also may be referred to as "gate-" or "channel-islands". Each island may comprise channel region portions remaining of the active layer with a sacrificial layer portion (or "dummy-gate portion"), and an interlayer-dielectric portion on top. The channel region portions will form channel regions of the horizontal channel transistors of the logic cells. In reference

[1] the trenches 210 are referred to as ANTIGATE-trenches and the location of the gate is referred to as the GATE_INTEND.

FIGS. 11a-11f only shows trenches 210 extending into the viewing plane. It should however be noted that also trenches with a transverse extension (i.e. along the viewing plane) may be formed through the layer stack 200.

The patterning of the layer stack 200 may further comprise forming of an initial set of trenches through the layer stacks prior to forming the cuts/trenches 210 (which accordingly may be referred to as a second set of trenches 210). The initial set of trenches may like the (second) trenches 210 be formed using a high-aspect-ratio etch. The initial set of trenches may be etched using an initial etch mask defining an initial trench pattern (e.g. a resist-based mask with a lithographically defined initial trench pattern). The initial etch mask may be removed after the initial set of trenches have been formed. The active layer may need to be divided/cut also in regions other than those of the trenches 210. Forming an initial set of trenches allows this and may accordingly serve as an initial active layer patterning. The initial set of trenches may accordingly separate the layer stack 200 into a preliminary set of sub-stacks, which then may be further partitioned into the afore-mentioned set of sub-stacks by the forming of the trenches 210. The initial set of trenches may be filled with a sacrificial fill material (e.g. an organic spin-on-layer such as spin-on-carbon) prior to forming the hard mask 208. The sacrificial fill material may be removed during the etching of the trenches 210.

Figure 11A:
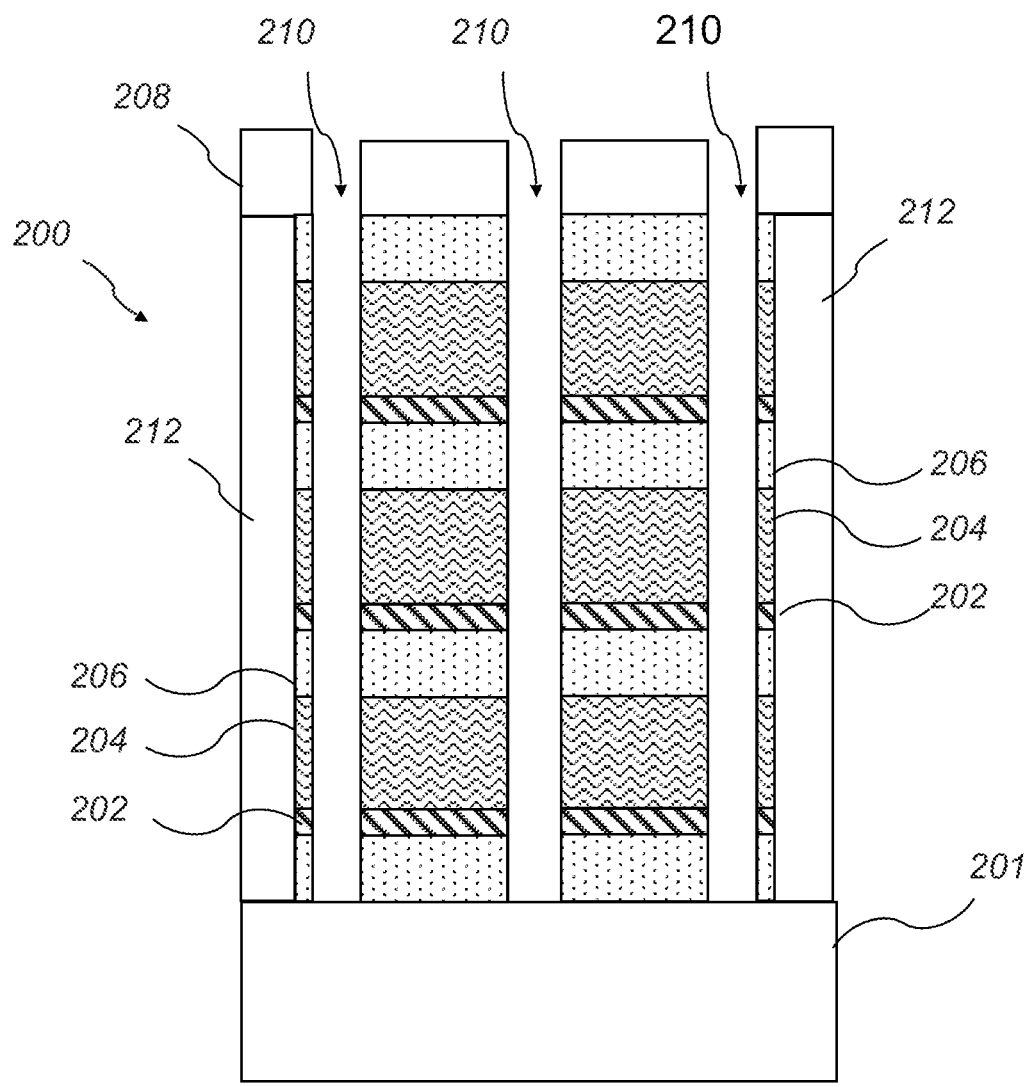
FIGS. 11a-11f illustrate an example method for forming a 3D IC.
Figure 11B:
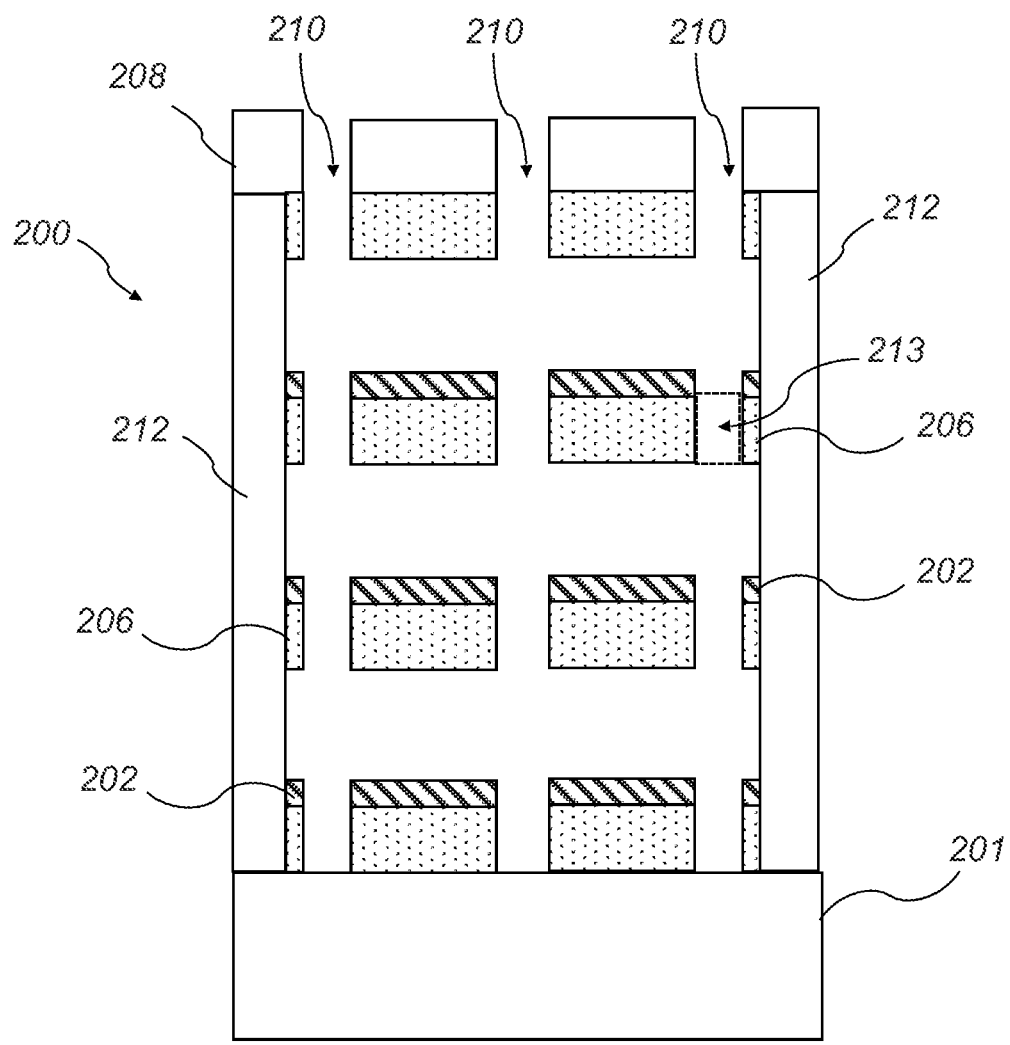

By using a selective isotropic etch process (wet or dry), the dummy-gate material may then be removed from each island, as shown in FIG. 11b. As dummy-gate material removal may involve removing a considerable amount of material from the stack, a mechanical support may be provided for remaining portions of the active layer and inter-layer dielectric. This may be achieved by the design rule that every gate-island/sub-stack is touching/abutting a vertical support wall of an insulating material, such as silicon oxide. A "tall" support wall may be formed by etching a wall trench through the full thickness of the layer stack and filling the wall trench with oxide material to form the tall support wall, denoted 212 in FIG. 11a. Tall support walls 212 may e.g. be formed prior to forming the cuts 210 in the layer stack. In reference [1] the support walls are referred to as OXWALL.

In addition to tall support walls 212, a number of "short" support walls may also be formed. A short support wall may bridge the gap between inter-layer dielectric portions of a sub-stack not abutting a tall support wall 212 and inter-layer dielectric portions of a sub-stack abutting a tall support wall 212. Short support walls may e.g. be formed after forming the trenches 210 and prior to removing the sacrificial layer portions 204 from the sub-stacks.

Short support walls may more specifically be formed by selectively depositing a dielectric (e.g. silicon oxide) on sidewalls of the inter-layer dielectric portions such that a gap between inter-layer dielectric portions of neighboring sub-stacks is closed/bridged by the deposited dielectric. Thereby, inter-layer dielectric portions of a sub-stack may be physically joined with inter-layer dielectric portions of a neighboring sub-stack abutting a tall support wall. The dielectric may be deposited on sidewalls of the inter-layer dielectric portions facing any one of the (second) trenches 210 as well as sidewalls of the inter-layer dielectric portions facing any one of the initial set of trenches. Dielectric deposited in the trenches 210 may be removed, e.g. by etching through the trench pattern in the hard mask 208, such that short support walls 210 remain only in the initial set of trenches. By way of example, the dashed box 213 indicate selectively deposited dielectric material prior to being removed by etching.

Figure 11C:
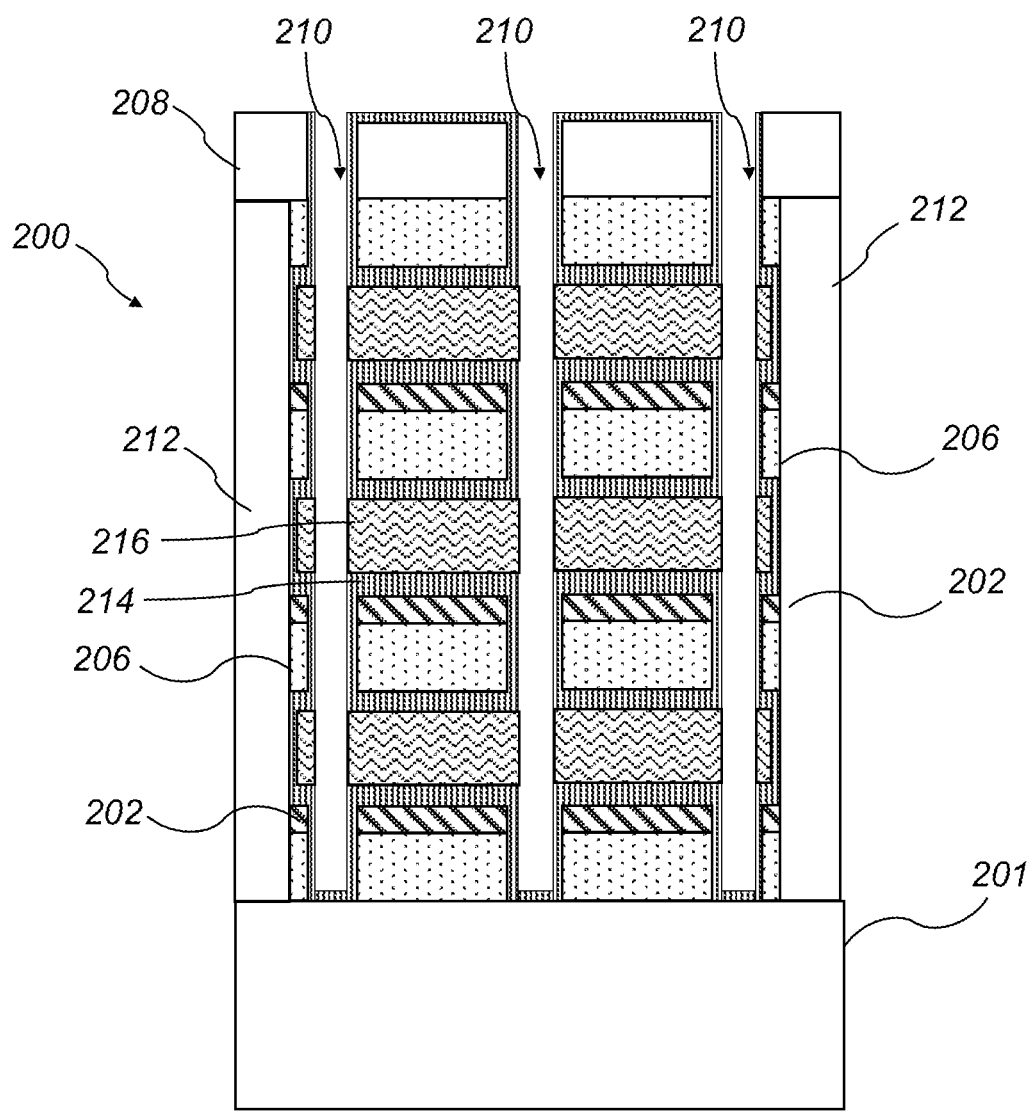
Figure 11D:
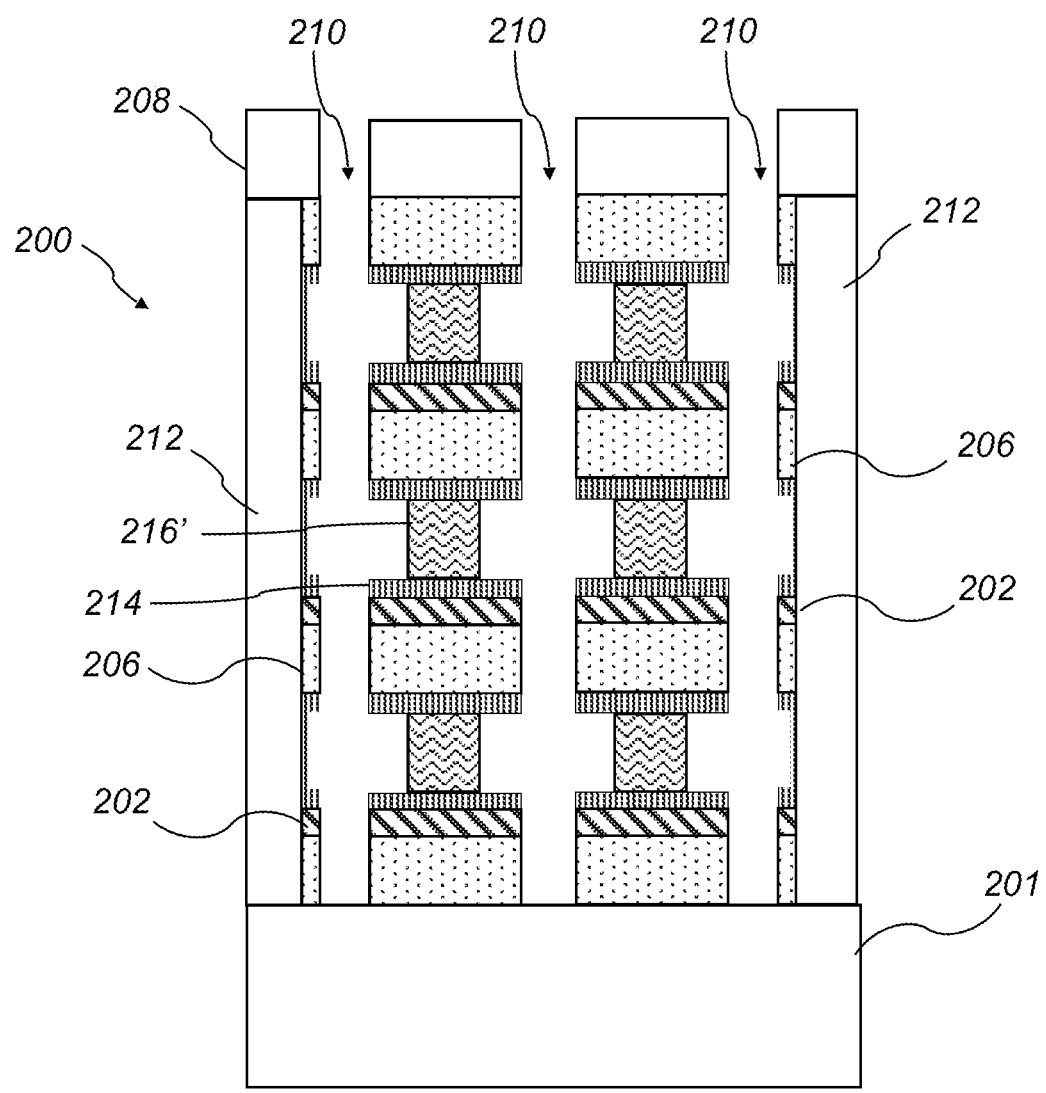

After removing the sacrificial layer portions 204, a gate-dielectric 214 (e.g. of a high-k dielectric) and then a gate electrode material (e.g. one or more gate metals such as work function metal and fill metal) may then be deposited in the form of gate lines 216 in the space/cavity formed by removing the dummy-gate (FIG. 11c). The gate lines 216 may thus extend across the channel region portions 202. Conformal deposition processes may be used for the deposition of the gate-dielectric 214 and the gate electrode material(s) 216. The trenches 210 may subsequently be re-etched (e.g. using the hard mask 208 as an etch mask) to remove gate electrode material deposited in the trenches 210.

Figure 11E:
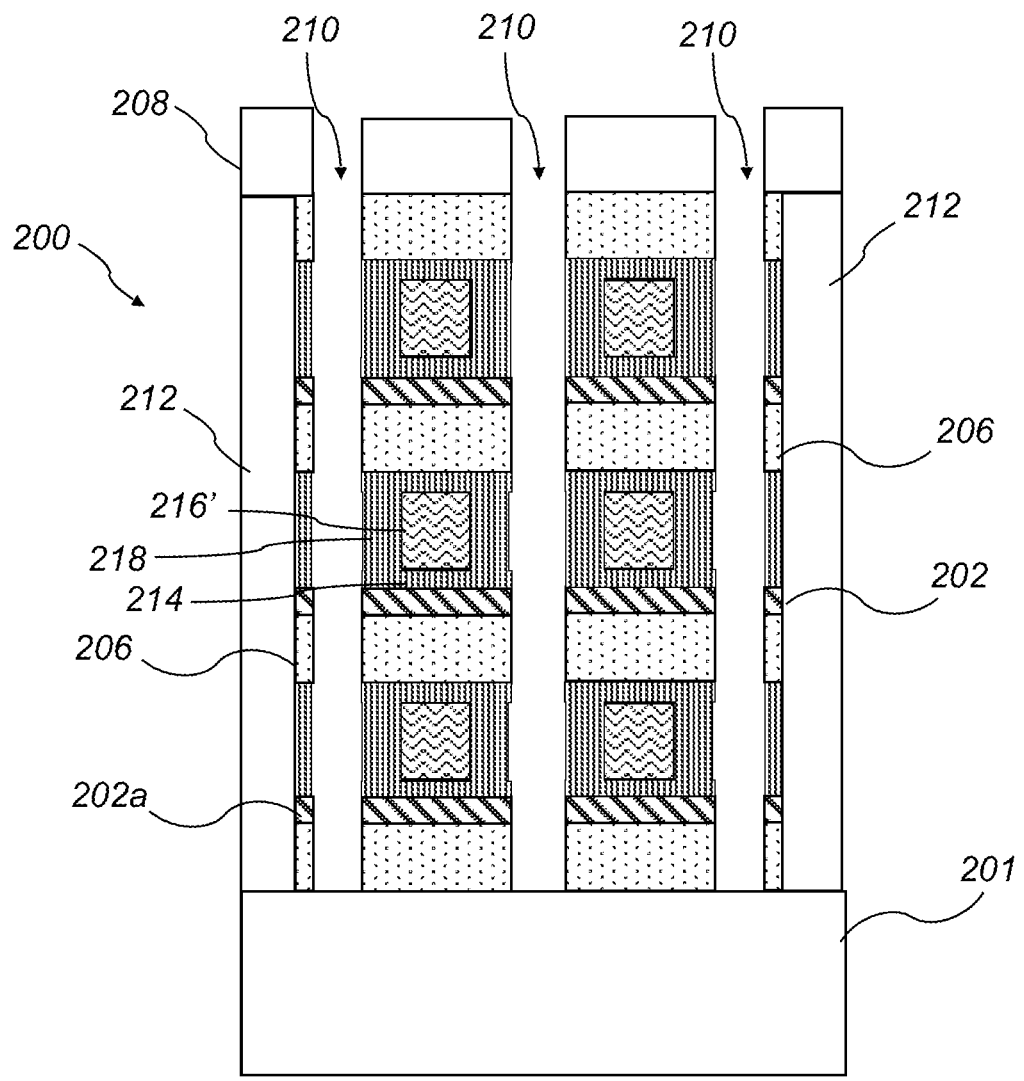

The process may then proceed with forming of spacers 218 (i.e. insulating sidewall spacers) for the gate (lines). Spacer formation may proceed by first recessing the (metal) gate lines 216 from the sides (FIG. 6d) by an isotropic (metal) etch to form recessed gate lines 216' and fill the thus formed cavity with the spacer material (FIG. 6e). In FIG. 11e the spacers 218 are indicated with a same pattern as the gate oxide 214. The spacer material may however be formed of a different material, for example SiCO, SiCN or SiN. The excess material in the trenches 210 may then be removed by an anisotropic etch (e.g. a high-aspect-ratio etch), e.g. using the patterned hard mask as an etch mask, thereby arriving at the structure shown in FIG. 11e.

The process may then proceed with forming source/drain regions 220 on ends of the channel region portions 202 facing the trenches 210. A suitable epitaxial process may be used. The source/drain regions may be doped, suitably using in-situ doping during the epitaxy. P-type and N-type source/drain regions may be formed sequentially, by masking P-type device regions while forming the N-type source/drain regions and masking the N-type device regions while forming the P-type source/drain regions. The channel region portions and the source/drain regions form the active semiconductor pattern of the single active layer of the logic cell of each respective device tier. In reference [1] the active semiconductor pattern is referred to as ACTIVE.

The process may then proceed with forming the wiring lines and vertical pillars, i.e. vias. For the vias, vertical holes may be etched through the layer stack at positions where vias are needed within the logic cell layout. The holes may be filled with metal to form the vias. In reference [1] the vias are referred to as CONT_VERT. Horizontally extending cavities ("wiring cavities") may be formed by merging inter-layer dielectric portions of neighboring sub-stacks through selective deposition of a dielectric on sidewalls of the inter-layer dielectric portions 206 (i.e. similar to the above process for forming the short support walls). Inter-layer dielectric portions which were removed during the forming of the trenches 210 may thus be "restored" to form inter-device tier isolation for the wiring lines which are to be formed.

Wiring lines may then be formed by forming vertical holes through the layer stack, in communication with the wiring cavities, to serve as filling ports for the metal material forming the wiring lines. The wiring lines may be filled over the whole length of the line through these filling ports. The filling may advantageously employ a conformal deposition, such as atomic layer deposition (ALD). This may reduce a risk of pinch-off before the filling is complete. The metal in the fill ports may subsequently be removed and refilled with a dielectric, to cut the metal lines at this location. In reference [1] the locations of the metal cuts are referred to as METAL_CUT.

If connections between the wiring lines and gate lines of a layer is needed, the spacer formation and the source/drain formation may be preceded by filling the trenches 210 with an insulating material (e.g. $SiO_2$), and then etching away the insulating material from the trenches 210 in regions where no wiring line-to-gate line interconnection is to be formed (e.g. using a separate lithographically defined etch mask which then may be stripped). Accordingly, blocks of insulating material may be formed in the trenches at locations where wiring line-to-gate line interconnections are to be formed, the blocks covering side surface portions of the gate lines which are to be contacted with the wiring lines. To complete the interconnections, these blocks may be removed subsequent to forming the source/drain regions and the wiring cavities and prior to forming the wiring lines in the wiring cavities, thereby exposing the side surface portions of the gate lines to the metal of the wiring lines. In reference [1], wiring line-to-gate line interconnections are referred to as XCOUPLE.

Figure 11F:
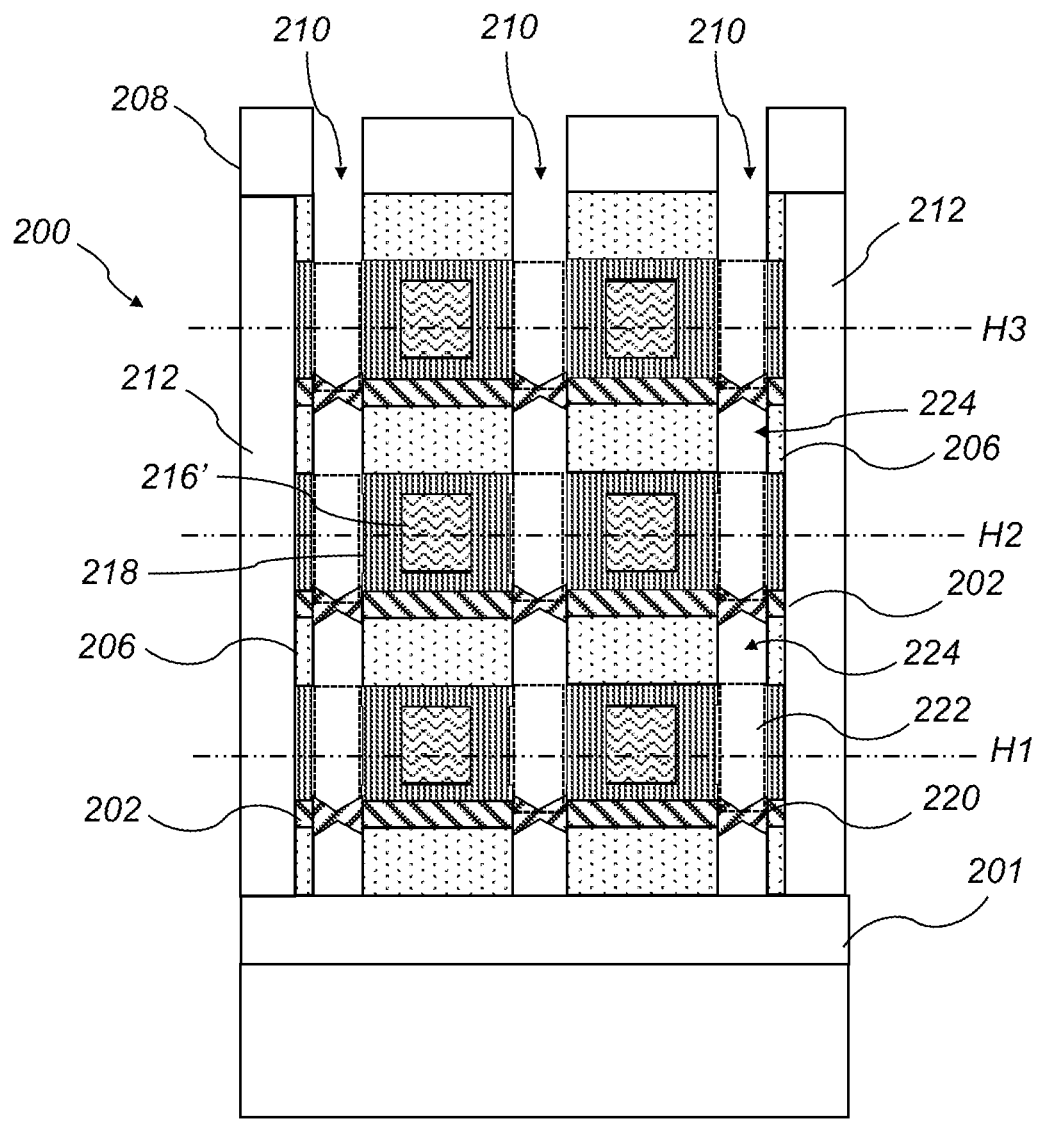

FIG. 11f shows the resulting structure with wiring lines 222 indicated with dashed outlines. Gate lines 216' extend across and over the channel region portions 202 of the horizontal channel transistors. The wiring lines 222 extend across and over source/drain regions of the active semiconductor pattern such the wiring lines abut the source/drain regions 220 at the crossings. Reference sign 224 indicate example regions in which the inter-layer dielectric may be restored to provide inter-tier isolation, as discussed above. The gate lines 216' and wiring lines 222 are arranged side-by-side. Gate line-wiring line separation is ensured by the spacers 218. The single layer of gate lines and wiring lines 216', 222 of each logic cell of each device tier is readily visible in the figure, also indicating a representation of respective common geometric horizontal planes H1-H3 intersected by all gate lines and wiring lines 216', 222 of the respective logic cell.

Optionally, input and/or output staircase structures (see below discussion), may be fabricated adjacent the stack of logic cells. The steps for the respective staircase structures 120, 130 may be formed sequentially, beginning with the bottom-most step. The fabrication of a step of a device tier may comprise forming a dielectric layer embedding horizontal (metal) output or input lines connecting to the logic cell (e.g. to the primary input logic gates or primary output logic gate) of the same device tier. A Damascene-type process may be used, comprising etching trenches in the dielectric layer and filling the trenches with metal to form the lines. Fabrication of the next step above may then follow by forming horizontal (metal) output or input lines with line ends located horizontal inside the line ends of the previous step, such that a staircase structure is obtained. However, this outline merely represents one example and other fabrication processes for staircase structures are as such known from VNAND technology (in which staircase structures may be used to provide individual control signals to transistor gates of the VNAND) and may be employed for forming the staircase structures.

Additional circuitry of the 3D IC, may be fabricated sequentially with the stack of logic cells. For example, active devices may be formed on the supporting substrate 201 using conventional front-end-of-line techniques, prior to forming the stack of logic cells. The active devices may subsequently be connected to the stack of logic cells via one or more higher-level routing layers, e.g. formed in a Damascene-type process adjacent to and on top of the device tiers after fabricating the stack of logic cells.

FIG. 1 depicts by way of example the layout of the conventional 6T SRAM bit cell. BL and BLB denotes a complementary pair of bit lines and WL denotes word lines. PG-1 and PG-2 denotes first and second pass transistors. PU-1 and PU-2 denotes first and second pull-up transistors coupled to the pull-up voltage rail denoted VDD. PD-1 and PD-2 denotes first and second pull-down transistors coupled to the pull-down voltage rail denoted VSS. To realize the stacked SRAM circuits according to the present invention, the layout of the conventional 6T SRAM bit-cell as shown in FIG. 1 however needs to be modified by (i) realizing the circuit connections shown in the schematic using a single routing layer; and (ii) ensuring the identical layout in all device tiers. In conventional 2D process technology, the 6T SRAM bit-cell typically requires three back-end-of-line (BEOL) routing layers to realize the connections shown in FIG. 1. Independent signal paths may be routed across each other without shorting using higher routing layers in BEOL and local vertical vias. The bit lines BL and BLB and supply voltage rails (VDD and VSS) may for example be provided in metal layer 2 of the BEOL and tapped to the transistors of the bit cell using local vertical vias. Such routing resources are not available in case each SRAM circuit comprises a single (i.e. only one) routing layer of horizontal conductive lines.

Figure 2:
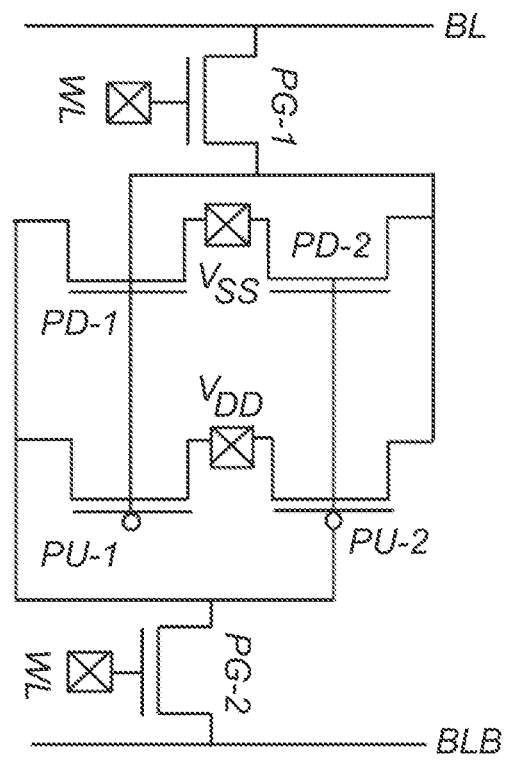
FIG. 2 depicts a circuit schematic of a bit cell according to an embodiment.

However, the constraints of a single routing layer and an identical circuit layout may be met by: (i) routing the bit lines BL and BLB, and the interconnections between the transistors of the bit cell horizontally in the single routing layer, and (ii) routing of the pull-up (PU) and pull-down (PD) supply voltage rails (e.g. VDD and VSS) and the word lines (WL) vertically through the stack of bit cells and thus be shared across all the bit cells of the stack. FIG. 2 depicts a circuit schematic or netlist of a bit cell according to an embodiment meeting these points, wherein lines indicate horizontally routed wiring lines or gate lines of the single routing layer and crossed boxes indicate vertically routed pull-up and pull-down voltage rails VDD and VSS and word lines WL.

FIG. 3 schematically depicts a 3D IC 100 comprising a plurality of SRAM circuits 104 each comprising a bit cell 106. The SRAM circuits 104 and the bit cells 106 each form part of one of a corresponding number of vertically stacked device tiers of the 3D IC 100 (e.g. Tier 1-3). The SRAM circuits 104 and the respective bit cells 106 have an identical layout and a same reference sign is thus used for the SRAM circuits 104 and the bit cells 106 of the different device tiers. Reference sign 102 indicates a substrate of the 3D IC 100. Axes X and Y indicate respectively first and a second horizontal cell directions. Axis Z indicates a vertical or bottom-up direction, normal to the horizontal plane XY and the main plane of extension of the substrate 101.

The SRAM circuits 104 are stacked on top of each other to define a stack of SRAM circuits 108 and a corresponding stack of bit cells. Owing to the identical layouts of the SRAM circuits 104, the respective bit cell 106 of any one of the SRAM circuits 104 has a corresponding bit cell (with identical layout) in each other bit cell of the stack of bit cells wherein the corresponding bit cells overlay or overlap each other as seen in the Z direction. In other words, the bit cells 106 of the stack of bit cells are arranged directly above or directly underneath each other.

As shown, the pair of bit lines BL, BLB of each SRAM circuit 104 (which also form part of the single routing layer of each SRAM circuit 104) extend in parallel in the Y direction, along mutually opposite sides of the respective bit cell 106. The bit lines BL, BLB are respectively connected to the first and second pass transistors PG-1, PG-2 of the bit cells 106, i.e. respective source/drain regions thereof.

The pull-up and pull-down voltage rails VDD, VSS and the word lines WL (two in FIG. 3, one for each pass transistor) are routed in the vertical Z direction through the stack of bit cells and connected to each bit cell 106. The pull-up and pull-down voltage rails VDD, VSS are as shown respectively connected to the pull-up transistors PU-1, PU-2 and the pull-down transistors PD-1, PD-2 of each bit cell 106, i.e. respective source/drain regions thereof. A single pair of pull-up and pull-down voltage rails VDD, VSS is hence shared by the first and second inverter pairs PU-1/PD-1 and PU-2/PD-2. The word lines WL are connected to each of the first and second pass transistors PG1, PG2, i.e. respective gates thereof.

While FIG. 3 only shows three device tiers comprising a bit cell the 3D IC 100 may more generally comprise N device tiers wherein N is 2 or greater, such as 4, 8, 16 or more. Additionally, the 3D IC 100 may comprise further device tiers which do not comprise SRAM circuits, above and/or below the device tiers comprising the SRAM circuits 104. For example, and as will be further described in the following, VDD, VSS and WL may be connected to a common routing layer stacked on top of the device tiers.

Figure 4:
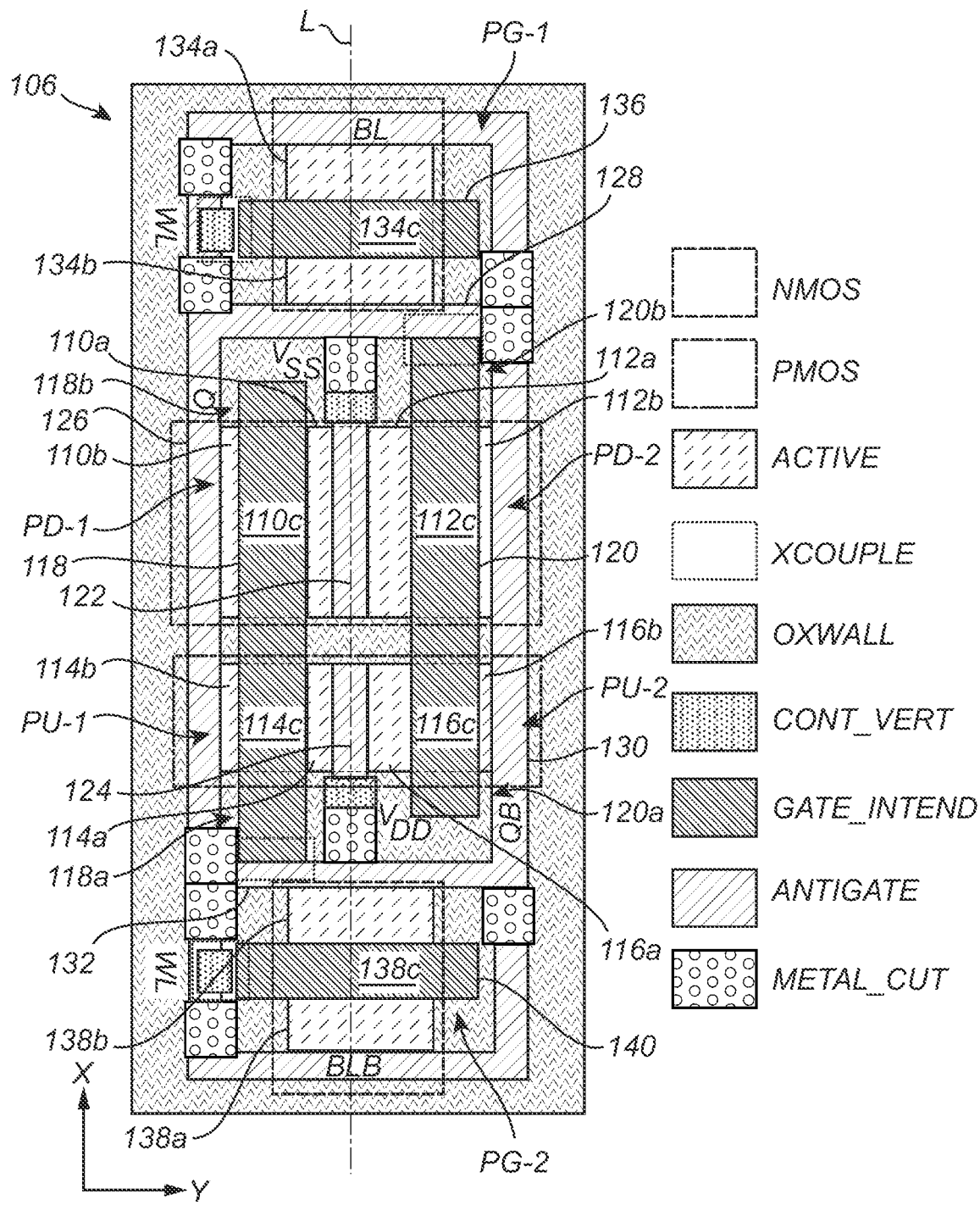
FIG. 4 shows the layout of the bit cells in FIG. 3 in a planar top-down view.

FIG. 4 further shows the layout of the bit cells 106 in FIG. 3 in a planar top-down view. Like in FIG. 3, X and Y denotes first and second cell directions. The legend indicates the respective circuit elements and structures of the bit cell 106 using the terminology introduced in [1]. ACTIVE denotes the active semiconductor pattern of the single active layer. GATE_INTEND and ANTIGATE denotes respectively the wiring lines and the gate lines of the single routing layer. The wiring lines in particular comprises the bit lines BL, BLB and the interconnections of the bit cell 106. XCOUPLE denotes locations within the single routing layer where there a connection is provided between a gate line and a wiring line. While depicted as a separate element, the XCOUPLE may as be appreciated from the above discussion of the fabrication flow be formed by an abutment or interface between surface portions of a wiring line and a line. METAL_CUT denotes locations of metal cuts between wiring lines of the single routing layer, which e.g. may be used as fill ports for forming the wiring lines and then be filled with dielectric during fabrication. The CONT_VERT squares are the vertically routed word lines WL and pull-up and pull-down voltage rails (i.e. supply lines), VDD and VSS. The OXWALL layers provide insulation surrounding the transistors, gate lines and wiring lines. As discussed above, the OXWALL layers may provide mechanical support for the structure during fabrication.

Accordingly, each SRAM circuit (104 in FIG. 3) comprises a single active layer forming an active semiconductor pattern (ACTIVE) of the transistors of the bit cell 106, and a single routing layer of horizontally routed conductive lines (ANTIGATE, GATE_INTEND) comprising a complementary pair of first and second bit lines connected to the bit cell 106, gate lines defining gates of the transistors of the bit cell 106, and wiring lines forming interconnections of the bit cell 106.

FIG. 4 depict an area-efficient implementation of a bit cell 106 wherein the two inverter pairs PD-1/PU-1 and PD-2/PU-2 are arranged adjacent each other such that PD-1 and PD-2 align in the Y-direction, and PU-1 and PU-2 align in the Y-direction. More specifically, the two inverter pairs PD-1/PU-1 and PD-2/PU-2 are arranged on mutually opposite sides of a geometrical line L (parallel to the X-direction), wherein PD-1 and PD-2 are arranged directly opposite each other and PU-1 and PU-2 are arranged directly opposite each other. The geometrical line L may in particular correspond to a center-line of the bit cell 106.

The single active layer of each SRAM circuit (104 in FIG. 3) comprises, for each bit cell 106, a set of active pattern portions, each active pattern portion comprising first and second source/drain portions and a channel portion of a respective one of: the first pass transistor PG-1, the second pass transistors PG-2, the first pull-down transistor PD-1, the second pull-down transistor PD-2, the first pull-up transistor PU-1, and the second pull-up transistor PU-2 of the bit cell 106. More specifically, the active pattern portion of the first pull-down transistor PD-1 comprises first and second source/drain regions 110a, 110b and a channel region 110c extending in the Y-direction between the source/drain regions 110a, 110b. The active pattern portion of the second pull-down transistor PD-2 comprises first and second source/drain regions 112a, 112b and a channel region 112c extending in the Y-direction between the source/drain regions 112a, 112b. The active pattern portion of the first pull-up transistor PU-1 comprises first and second source/drain regions 114a, 114b and a channel region 114c extending in the Y-direction between the source/drain regions 114a, 114b. The active pattern portion of the second pull-up transistor PU-2 comprises first and second source/drain regions 116a, 116b and a channel region 116c extending in the Y-direction between the source/drain regions 116a, 116b.

The single routing layer of each SRAM circuit comprises, for each bit cell 106, first and second gate lines 118, 120 extending in parallel in X-direction and being spaced apart in the Y-direction. The first gate line 118 overlaps the respective channel regions 110c, 114c of the first pull-down and pull-up transistors PD-1, PU-1 to define a respective gate of the first pull-down and pull-up transistors PD-1, PU-1. The second gate line 120 overlaps the respective channel regions 112c, 116c of the second pull-down and pull-up transistors PD-2, PU-2 to define a respective gate of the second pull-down and pull-up transistors PD-2, PU-2.

The first source/drain regions 110a, 112a, 114a, 116a are located between the first and second gate lines 118, 120, i.e. on an inside with respect to first and second gate lines 118, 120. The second source/drain regions 110a, 112a, 114a, 116a are arranged on an opposite side of the respective gate lines 118, 120, i.e. on an outer side with respect to first and second gate lines 118, 120. With reference to the geometrical line L, the first source/drain regions 110a, 112a, 114a, 116a may be referred to as proximal source/drain regions 110a, 112a, 114a, 116a (i.e. source/drain regions proximal to line L) and the second source/drain regions 110b, 112b, 114b, 116b may be referred to as distal source/drain regions 110b, 112b, 114b, 116b (i.e. source/drain regions distal to line L).

As shown, the pull-down voltage rail VSS is connected to the first (proximal) source/drain regions 110a, 112a of the first and second pull-down transistors PD-1, PD-2. The pull-up voltage rail VDD is connected to the first (proximal) source/drain regions 114a, 116a of the first and second pull-up transistors PU-1, PU-2. The pull-down and pull-up voltage rails VSS, VDD are arranged between, i.e. on the inside of, the gate lines 118, 120.

The single routing layer comprises first and second wiring lines 122, 124 parallel to and arranged between the gate lines 118, 120. The pull-down voltage rail VSS is connected to the first source/drain regions 110a, 112a of the first and second pull-down transistors PD-1, PD-2 by the first wiring line 122. The pull-up voltage rail VDD is connected to the first source/drain regions 114a, 116a of the first and second pull-up transistors PU-1, PU-2 by the second wiring line 124.

The first wiring line 122 extends between the pull-down voltage rail VSS and the first source/drain regions 110a, 112a of the first and second pull-down transistors PD-1, PD-2. The second wiring line 124 correspondingly extends between the pull-up voltage rail VDD and the first source/drain regions 114a, 116a of the first and second pull-up transistors PU-1, PU-2. Unless stated otherwise, a connection between a wiring line (e.g. 122 or 124) and a source/drain region (e.g. 110a, 112a, 114a, 116a) may be provided by the wiring line extending to overlap and abut the source/drain region.

To provide the cross-coupling between the inputs and outputs of the two inverter pairs PD-1/PU-1 and PD-2/PU-2, the single routing layer of the illustrated embodiment comprises a first L-shaped interconnection between the second (distal) source/drains 110b, 114b of the first pull-down and pull-up transistors PD-1, PU-1 and the second gate line 120, and a corresponding second L-shaped interconnection (mirrored with respect to the first L-shaped interconnection) between the second (distal) source/drains 112b, 116b of the second pull-down and pull-up transistors PD-2, PU-2 and the first gate line 118. As indicated in FIG. 4, the first and second L-shaped interconnections form the complementary storage nodes Q and QB of the bit cell 106.

The first L-shaped interconnection is defined by a third wiring line 126 and a fourth wiring line 128. The third wiring line 126 extends in parallel to the first gate line 118 in the X-direction and interconnects the second source/drain portions 110b, 114b of the first pull-down and pull-up transistors PD-1, PU-1. The fourth wiring line 128 extends in the Y-direction and interconnects the third wiring line 126 and the second gate line 120. The second L-shaped interconnection is defined by a fifth wiring line 130 and a sixth wiring line 132. The fifth wiring line 130 extends in parallel to the second gate line 120 in the X-direction and interconnects the second source/drain portions 112b, 116b of the second pull-down and pull-up transistors PD-2, PU-2. The sixth wiring line 132 extends in the Y-direction and interconnects the fifth wiring line 130 and the first gate line 118.

As shown in FIG. 4, the first and second gate lines 118, 120 extend in the X-direction between respective first and second end portions 118a, 118b and 120a, 120b. The fourth wiring line 128 extends between the third wiring line 126 and the second end portion 120b of the second gate line 120, past and at a distance from the second end portion 118b of the first gate line 118. As may be seen in FIG. 4, the clearance with respect to the second end portion 118b of the first gate line 118 is created by the third wiring line 126 extending past the second end portion 118b in the X-direction. That is, the third wiring line 126 has an end portion protruding past the second end portion 118b of the first gate line 118. Correspondingly, the sixth wiring line 132 extends between the fifth wiring line 130 and the first end portion 118a of the first gate line 118, past and at a distance from the first end portion 120a of the second gate line 120. As may be seen in FIG. 4, the clearance with respect to the first end portion 120a of the second gate line 120 is created by the fifth wiring line 130 extending past the first end portion 120a in the negative X-direction. That is, the fifth wiring line 130 has an end portion protruding past the first end portion 120a of the second gate line 120.

Still with reference to FIG. 4, the first and second pass transistors PG-1, PG-2, each comprise first and second source/drain regions 134a, 134b and 138a, 138b and a channel region 134c, 138c extending in the first cell direction between the respective source/drain regions 134a, 134b and 138a, 138b. The first source/drain region 134a of the first pass transistor PG-1 is connected to the first bit line BL, and the second source/drain region 134b of the first pass transistor PG-1 is connected to the fourth wiring line 128, e.g. by the fourth wiring line 128 overlapping and abutting the second source/drain region 134b of the first pass transistor PG-1. Correspondingly, the first source/drain region 138a of the second pass transistor PG-2 is connected to the second bit line BLB, and the second source/drain region 138b of the second pass transistor PG-2 is connected to the sixth wiring line 132, e.g. by the sixth wiring line 132 overlapping and abutting the second source/drain region 138b of the second pass transistor PG-2.

The single routing layer further comprises third and fourth gate lines 136 and 140 extending in the Y-direction. The third gate line 136 overlaps the channel region 134c of the first pass transistor PG-1 to define a gate thereof. The fourth gate line 140 overlaps the channel region 138c of the second pass transistor PG-2 to define a gate thereof.

While FIG. 4 depicts an area-efficient layout of a bit cell using a single shared pair of pull-down and pull-up voltage rails VSS, VDD, other layouts are also possible. For instance, the channel regions 134c, 138c and the gate lines 136, 140 of the first and second pass transistors PG-1, PG-2 may be oriented in the X-direction, wherein the single routing layer may comprise additional wiring lines for connecting the source/drain regions 134a, 134b and 138a, 138b of the pass transistors PG-1, PG-2 to the bit lines BL, BLB and the fourth and sixth wiring lines 128, 132. According to another example, the pull-down and pull-up voltage rails VSS, VDD need not be aligned with the first and second wiring lines 122, 124, but may be displaced with respect to the geometrical line L (e.g. to be aligned with the first and second gate lines 118, 120, respectively) and connected to the first and second wiring lines 122, 124 by an additional respective wiring line extending in the Y-direction.

Figure 5A:
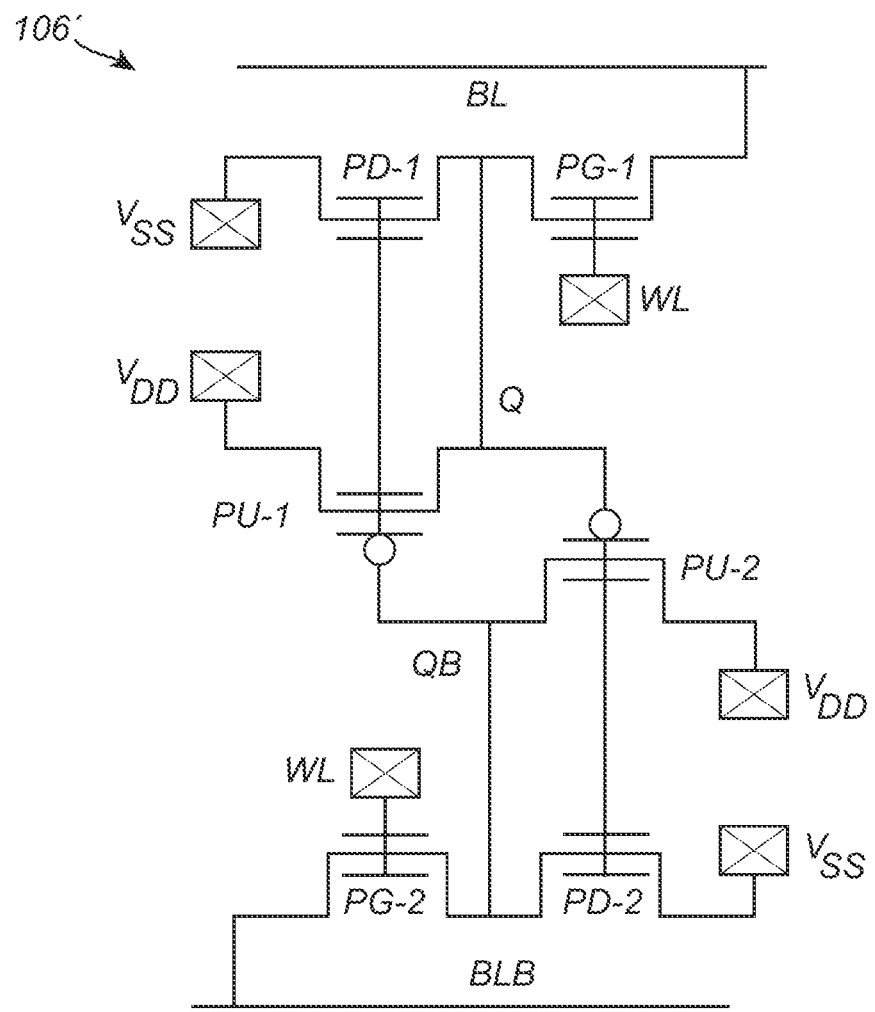
FIGS. 5a and 5b show the netlist and layout, respectively, of a bit cell according to a further embodiment.
Figure 5B:
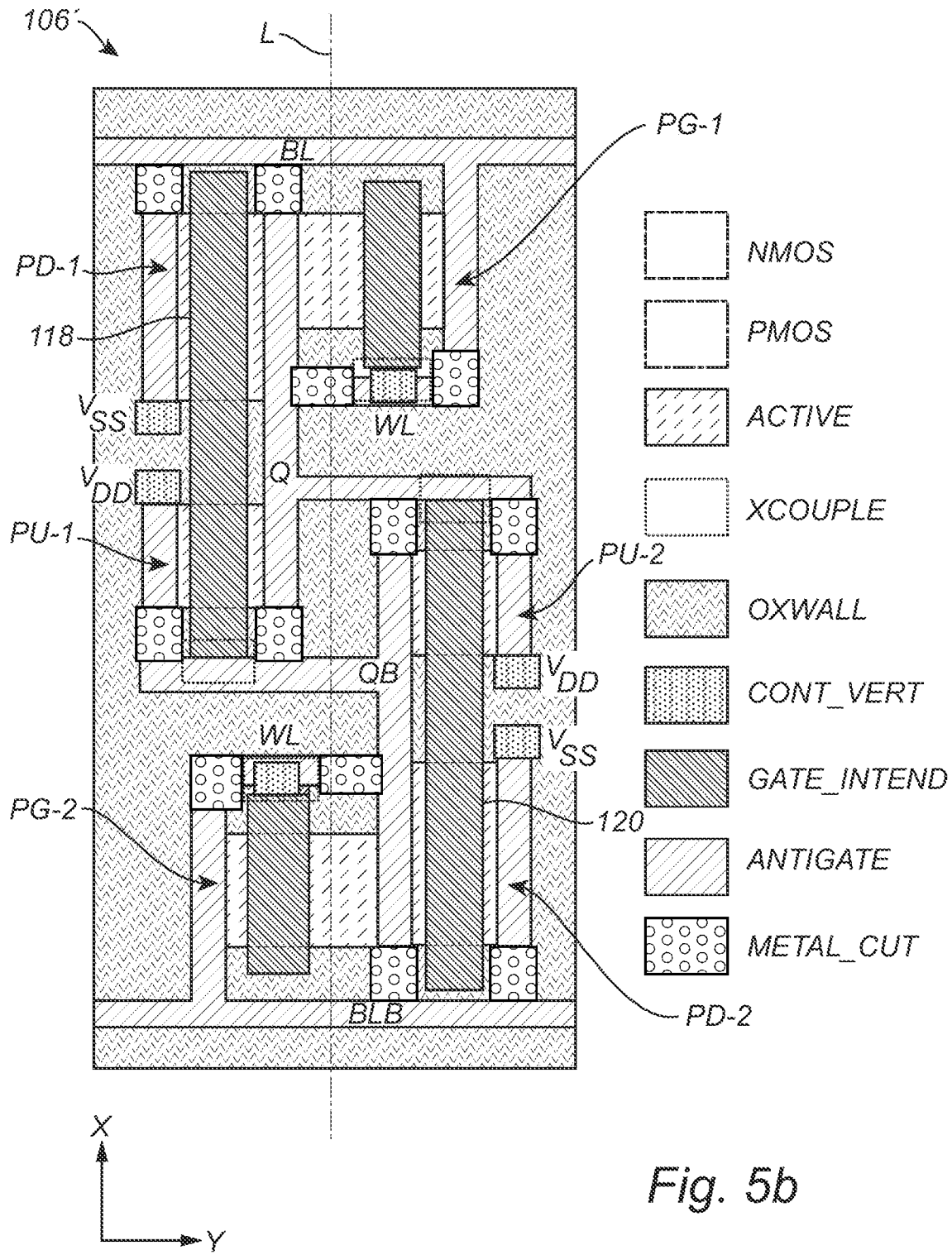

According to an alternative embodiment of an SRAM circuit and a bit cell, the first pull-down transistor PD-1 may be connected to a first pull-down voltage rail VSS1 and the first pull-up transistor PU-1 may be connected to a first pull-up voltage rail VDD1, and the second pull-down transistor PD-2 may be connected to a second pull-down voltage rail VSS2 and the second pull-up transistor PU-2 may be connected to a second pull-up voltage rail VDD2. The pull-up and pull-down voltage rails may hence be duplicated so that a respective pair of pull-down and pull-up voltage rails VSS1/VDD1 and VSS2/VDD2 may be provided for the respective inverter pairs PD-1/PU-1 and PD-2/PU-2 of each bit cell of the stack of bit cells. Each one of the pull-up and pull-down voltage rails VSS1/VDD1 and VSS2/VDD2 may be routed to extend vertically through the stack of bit cells and connected to each bit cell of the stack of bit cells. This duplication may facilitate routing of the conductive lines within the single routing layer while meeting the "no-crossing" rule of the 3D Nanofabric. Such an embodiment is illustrated in FIGS. 5a-5b, wherein FIG. 5a shows the netlist of a bit cell 106' and FIG. 5b is a top-down view of the layout of the bit cell 106'.

Like the bit cell 106 shown in FIG. 4, the single routing layer of the bit cell 106' comprises first and second gate lines 118, 120 extending in parallel in the X-direction and spaced apart in the Y-direction. Also like the bit cell 106, the two inverter pairs PD-1/PU-1 and PD-2/PU-2 are arranged on mutually opposite sides of a geometrical line L (parallel to the X-direction, e.g. defining a center-lien of the bit cell 106').

However, unlike the bit cell 106, the first pull-down and pull-up voltage rails VSS1, VDD1 are arranged on, and connected to respective source/drain regions of the first pull-down and pull-up transistors PD-1, PU-1 on, an "outer" side of the first gate line 118, i.e. a side distal to the geometrical line L. The distal side hereby refers to the side of the first gate line 118 which is opposite to the side of the first gate line 118 which is proximal to (i.e. located between) the first gate line 118 and the geometrical line L. Correspondingly, the second pull-down and pull-up voltage rails VSS2, VDD2 are arranged on, and connected to respective source/drain regions of the second pull-down and pull-up transistors PD-2, PU-2 on, an "outer" side of the second gate line 120, i.e. a side distal to the geometrical line L. The distal side hereby refers to the side of the second gate line 120 which is opposite to the side of the second gate line 118 which is proximal to (i.e. located between) the second gate line 120 and the geometrical line L. The pairs of pull-up and pull-down voltage rails VSS1, VDD1 and VSS2, VDD2 may hence be located on an "outside" of the inverter pairs, with respect to the first and second gate lines 118, 120. This may facilitate the cross-coupling of the first and second inverter pairs by reducing a congestion in the region between the inverter pairs. The cross-couplings may as shown hence be provided by a first T-shaped interconnection between the second gate line 120 and the source/drains of the first pull-down and pull-up transistors PD-1, PU-1 on the "inner" (proximal) side of the first gate line 118, and by a corresponding second T-shaped interconnection (mirrored with respect to the first T-shaped interconnection) between the first gate line 118 and the source/drains of the second pull-down and pull-up transistors PD-2, PU-2 on the "inner" (proximal) side of the second gate line 120.

Figure 6:
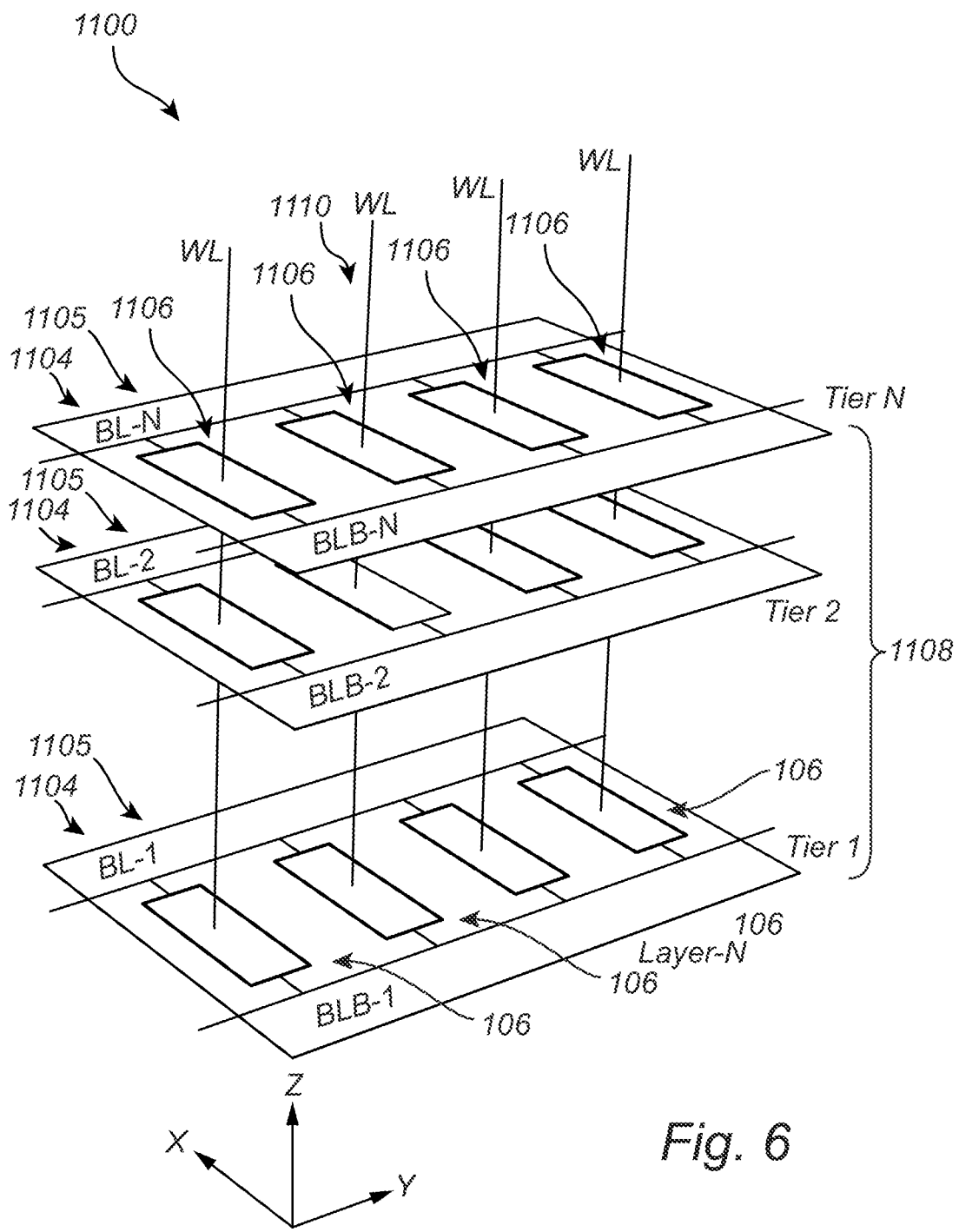
FIG. 6 shows a 3D IC according to a further embodiment.

FIG. 6 shows an embodiment of a 3D IC 1100 wherein SRAM circuits 1104 having an identical layout have been stacked on top of each other to define an SRAM circuit stack 1108 of SRAM circuits 1104. Each SRAM circuit 1104 forms part of a respective device tier of the 3D IC 1100 (in the illustrated embodiment comprising Tiers 1, 2, . . . N). Each SRAM circuit 1104 comprises an SRAM bit cell array 1105 of identical SRAM bit cells 106. The SRAM bit cell arrays 1105 of the respective SRAM circuits 1104 are stacked on top of each other to define a bit cell stack array 1110 of a plurality of bit cell stacks 1106. Thus, each bit cell stack 1106 comprises a plurality of bit cells 106 of an identical layout stacked on top of each other.

For simplicity, FIG. 6 only shows a single column of 4 (four) bit cells 106 of each SRAM circuit 1104, however the arrays 1105 of each SRAM circuit 1104 may more generally comprise one or more number of columns and two or more rows. The following description applies correspondingly to each column of bit cells 106, and correspondingly to each column of bit cell stacks 1106.

As indicated in FIG. 6, the single routing layer of each SRAM circuit 1104 accordingly comprises, for each column of bit cells 106 of the bit cell array 1105 of the SRAM circuit 1104, a complementary pair of first and second bit lines BL, BLB connected to each bit cell 106 of the column. The single routing layer further comprises, for each bit cell 106 of the bit cell array 1105 of the SRAM circuit 1104, gates of transistors of the bit cell 106 (e.g. PG-1, PG-2, PU-1, PD-1, PU-2, PD-2), and wiring lines forming interconnections of the bit cell 106, c.f. FIG. 4.

As shown in FIG. 6, the bit cells 106 of each bit cell stack 1106 of the array 1102 of the 3D IC 1100 is connected to a respective set of word lines WL<0-3> routed vertically through respective stacks 1106. Although not shown in FIG. 6, this applies correspondingly to the pull-up and pull-down voltage rails (e.g. VSS, VDD).

While the SRAM circuits 1104 as shown comprise bit cells 106, it is also possible to use the bit cell 106' shown in FIGS. 5a-5b instead. In this case, respective sets of duplicated voltage rails VSS1, VDD1 and VSS2, VDD2 may be routed vertically through each respective bit cell stack 1106.

Figure 7A:
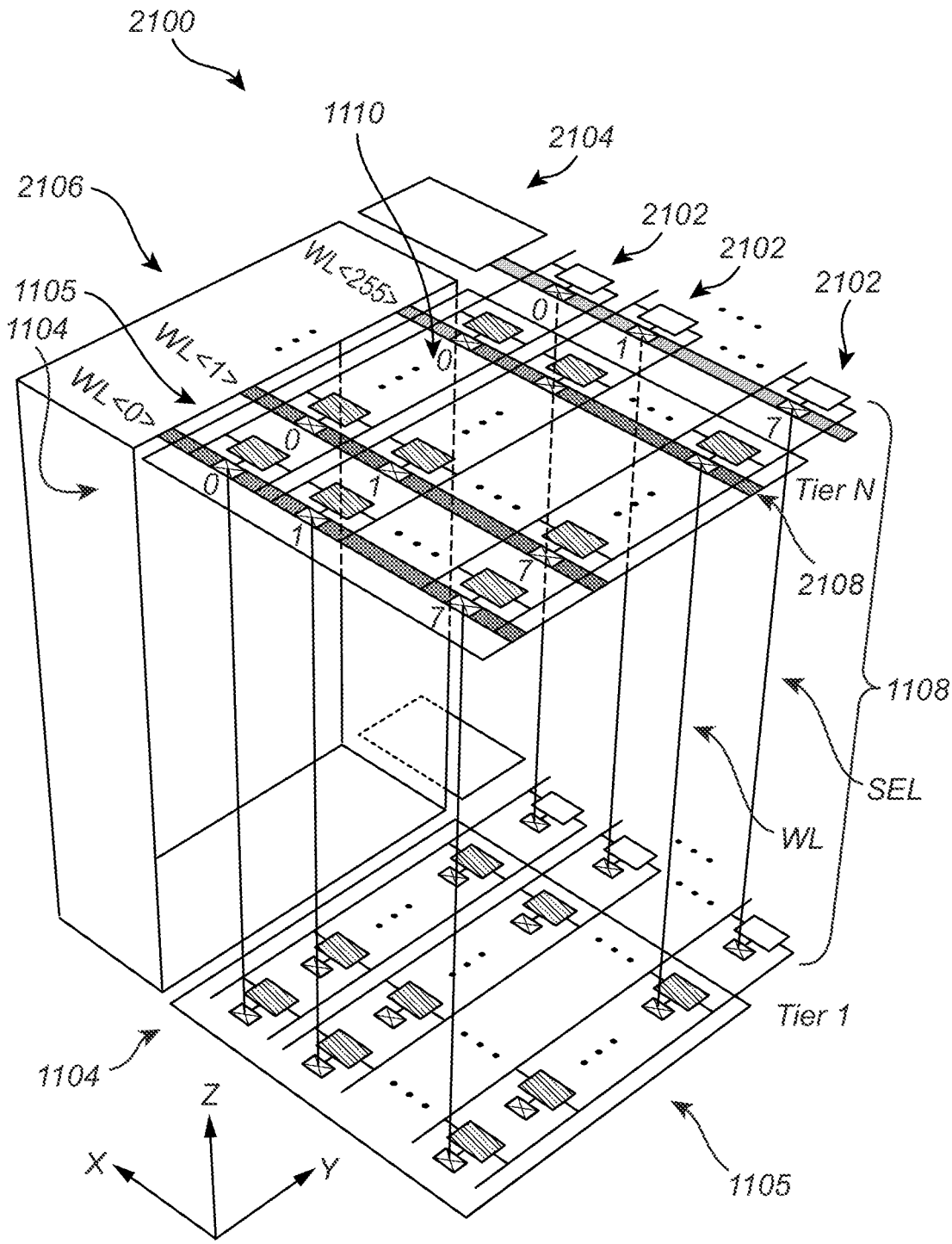
FIGS. 7a-7c shows a 3D IC according to a further embodiment.
Figure 7B:
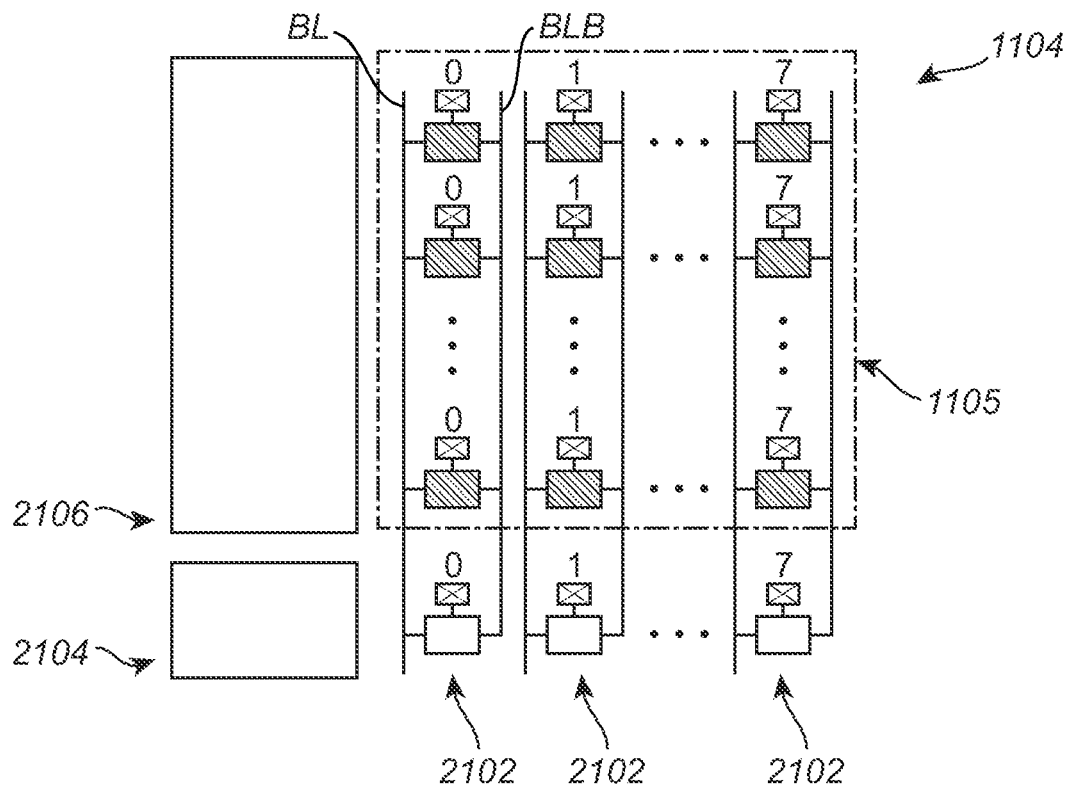
Figure 7C:
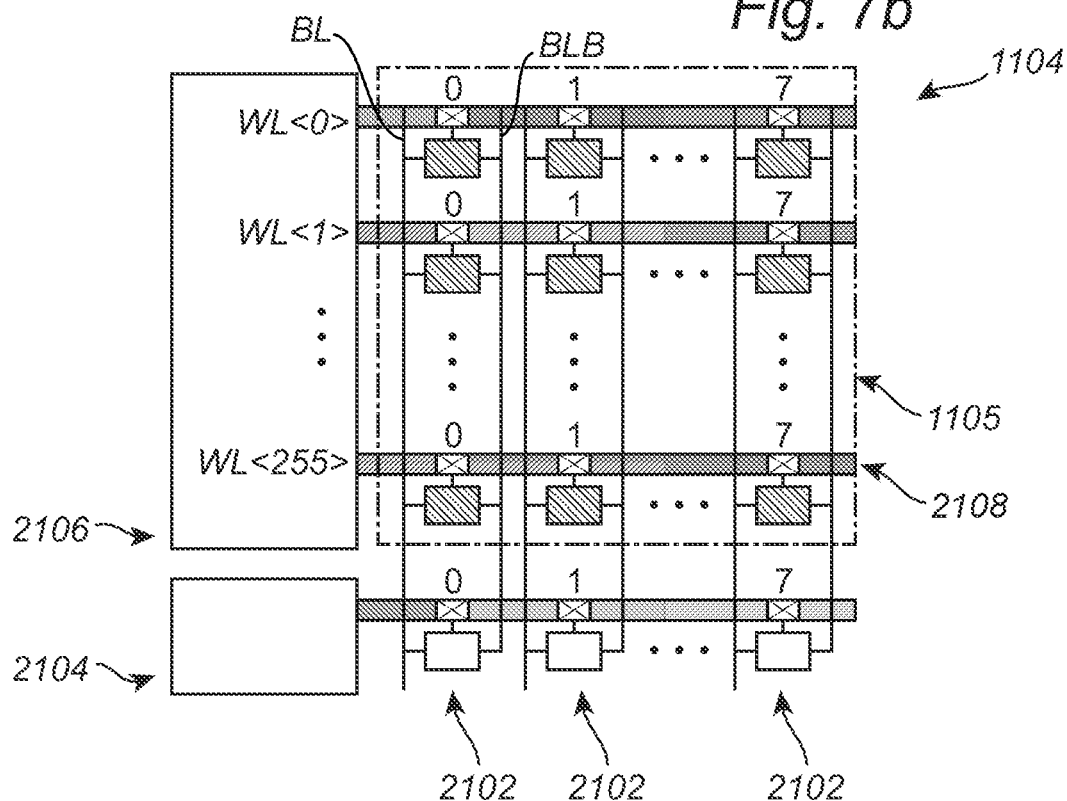

FIG. 7a is a schematic perspective view of a 3D IC 2100 according to a further embodiment. FIGS. 7b-c show respectively a top-down view of a bottom tier (Tier 1) and a top tier (Tier N) of the 3D IC 2100. The view in FIG. 7b is representative for all tiers below the top tier. The 3D IC 2100 corresponds to the 3D IC 1100 and comprises a stack 1108 of SRAM circuits 1104, each comprising an SRAM bit cell array 1105. For purpose of illustrative clarity, each bit cell of each SRAM bit cell array 1105 is represented by a box with a diagonal hatching rather than a reference sign. Similar to the preceding embodiment, the bit cells are assumed to be implemented in accordance with bit cell 106 of FIG. 4, but may alternatively be correspond to bit cell 106' of FIGS. 5a-5b. The illustrated part of the 3D IC 2100 may for example form a sub-array which may be used as part in a global SRAM macro.

In FIGS. 7a-7c, the column number of each SRAM bit cell array 1105 is indicated by the number above each respective bit cell and the row number corresponds to the number of the word line WL<0, 1, . . . 255> of the row decoder 2106 connected to each respective row. In the illustrated embodiment, each SRAM bit cell array 1105 accordingly comprises 256 rows and 8 columns of bit cells, however this is only one example and other array dimensions are also possible such as 64×32. The number of stacked SRAM bit cell arrays 1105 of the 3D IC 2100 may e.g. be 4, 8, 16, 32 or more.

The 3D IC 2100 differs from the 3D IC 1100 in that each SRAM circuit 1104 further comprises a set of supplementary circuits 2102, each supplementary circuit 2102 connected to a respective pair of bit lines BL, BLB of a column of bit cells. Each supplementary circuit 2102 may comprise at least one of a pre-charge circuit, a sense amplifier, a write driver and a data latch. The supplementary circuits 2102 are stacked on top of each other to define a respective stack of supplementary circuits (i.e. a supplementary circuit stack) for each column of bit cell stacks (e.g. 1106 in FIG. 6) of the bit cell stack array.

The 3D IC 2100 further comprises a set of select lines (commonly indicated by SEL in FIG. 7a) routed vertically through the respective supplementary circuit stacks and connected to each supplementary circuit 2102 thereof.

As the supplementary circuits 2102 of each device tier is comprised in the SRAM circuit 1104 of the device tier, it follows that each supplementary circuit of an SRAM circuit 1104 forms part of the single active layer and the single routing layer of the SRAM circuit 1104. Each supplementary circuit 2102 may in general comprise a network of interconnected logic gates and each logic gate may comprise a network of interconnected transistors. Accordingly, the active semiconductor pattern of the single active layer of each SRAM circuit 1104 further comprises the active pattern portions (i.e. the source/drain regions and channel regions) of each transistor of the logic gates of each supplementary circuit 2102 of the SRAM circuit 1104, and the single routing layer of each SRAM circuit 1104 further comprises, for each logic gate of each supplementary circuit 2102 of the SRAM circuit 1104, gate lines of each transistor and wiring lines forming the interconnections of the network of logic gates and the network of transistors of each of the logic gates. As used herein, the term "logic gate" refers to (a portion of) circuitry configured to implement a Boolean or logic function. A logic gate may either be a single logic gate or a compound logic gate. A circuit comprising a network of logic gates may be configured to implement the (compound) function defined by the network of logic gates of the circuit. The types of logic gates of the logic cells may vary depending on application. Generally, each logic gate may be a logic gate of a respective type selected from the group comprising: NOT, AND, OR, NAND, NOR, EXOR, MUX.

The network of logic gates of each supplementary circuit 2102 of each stack of supplementary circuits may be configured to implement at least one of a pre-charge circuit, a sense amplifier, a write driver and a data latch.

Figure 8A:
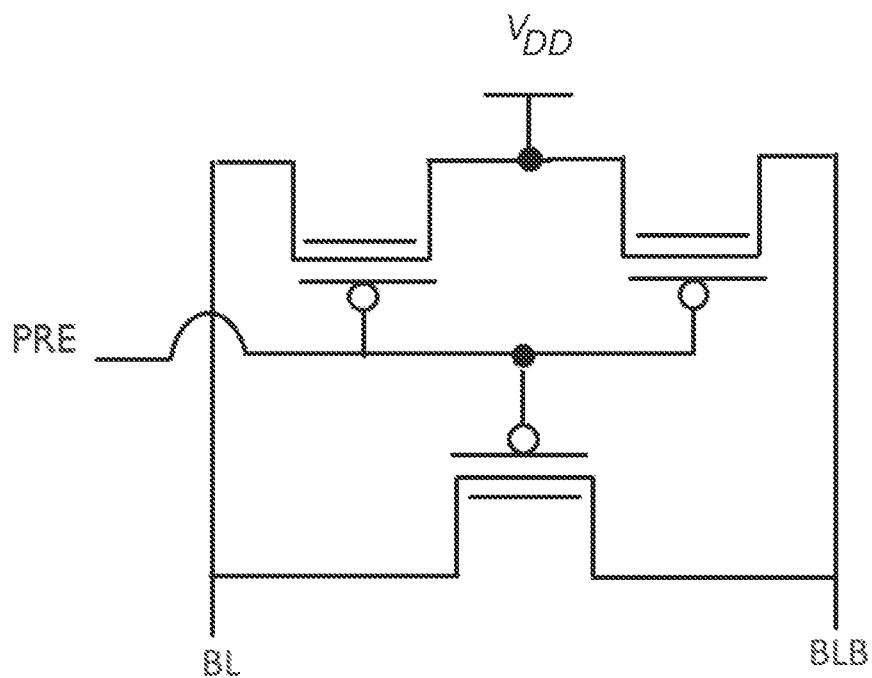
FIGS. 8a and 8b show a circuit schematic of a conventional pre-charge circuit and a pre-charge circuit according to an embodiment, respectively.
Figure 8B:
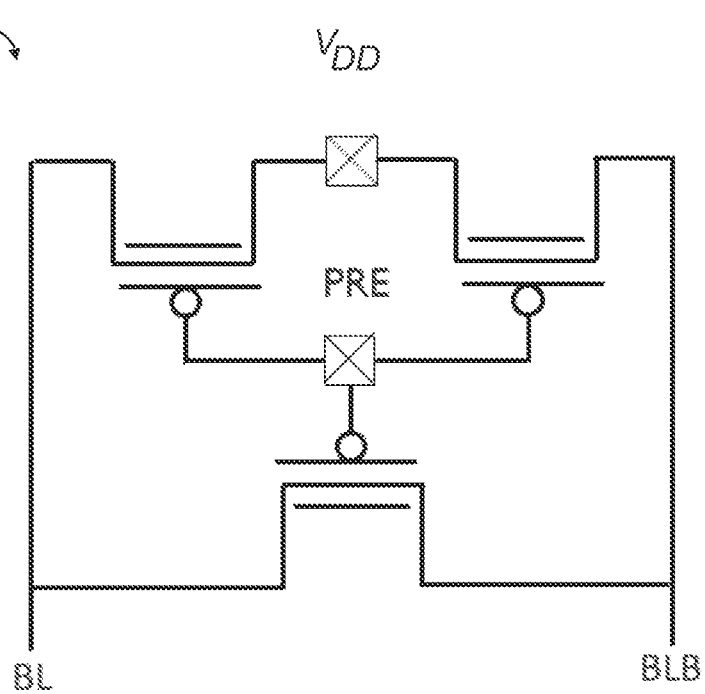

A pre-charge circuitry is a circuit configured to bring its associated bit lines BL, BLB to a high (logic) voltage level (e.g. VDD) before the read and the write cycles. FIG. 8a depicts a typical conventional pre-charge circuitry which comprises a single metal crossing. FIG. 8b shows an example netlist of a modified pre-charge circuit 2102a obviating the metal crossing in FIG. 8a. As shown, the metal crossing in the conventional pre-charge circuitry is avoided by providing the pre-charge enable signal (PRE), as well as the supply rail (VDD) in the vertical dimension (indicated by the crossed box).

FIG. 9a shows a typical conventional current controlled latching sense amplifier (SA) with a decoupled transistor. This type of SA exhibits high sensing speed. A low voltage on the sense amplifier select line SAE enables transistors M8 and M9 and connects the bit lines BL, BLB with the latch. For data read, the select line SAE is enabled and the differential voltage is amplified as the node with low voltage is discharged to ground through the transistors M5/M6 and M7. As shown in FIG. 9a this type of sense amplifier circuit has more than four metal crossing that conventionally may be routed using higher metal layers in. FIG. 9b shows a SA circuit 2102b according to an embodiment which has been modified compared to FIG. 9a by (i) using two NMOS transistors (i.e., M7-1 and M7-2) instead of the single current source transistor M7 in FIG. 9a, and (ii) providing the select line SAE signal, as well as the supply rails, VDD and VSS in the third dimension, i.e. vertically. The metal crossings of the circuit in FIG. 9a may hence be avoided such that the sense amplifier may be realized in accordance with the Nanofabric no-crossing rule.

In more detail, the SA circuit 2102b (of each respective tier) is connected to the horizontally routed bit lines BL and BLB of a respective column of bit cells (of the respective tier). The SA circuit 2102b comprises a latch circuit comprising a first inverter pair (PMOS/pull-up transistor M1 and NMOS/pull-down transistor M3) and a second inverter pair (NMOS/pull-down transistor M2 and PMOS/pull-up transistor M4). The first and second inverter pairs are as shown cross-coupled. That is, the input of the first inverter pair (i.e. the common gate of M1 and M3) is connected to the output of the second inverter pair (i.e. the interconnected source/drain regions of M2 and M4), e.g. at the common node A. Conversely, the input of the second inverter pair (i.e. the common gate of M2 and M4) is connected to the output of the first inverter pair (i.e. the interconnected source/drain regions of M1 and M3), e.g. at the common node B.

The pull-up transistor M1 is connected to a vertical first pull-up voltage rail (VDD) and the pull-up transistor M4 is connected to a vertical second pull-up voltage rail (VDD).

The pull-down transistor M3 is connected to a vertical first pull-down voltage rail (VSS) via first and second current source transistors M7-1 and M6 (e.g. being NMOS transistors), wherein the gate of the first current source transistor M7-1 is connected to a vertical first select line SAE and the gate of the second current source transistor M6 is connected to the complementary bit line BLB.

Correspondingly, the pull-down transistor M2 is connected to a vertical second pull-down voltage rail (VSS) via third and fourth current source transistors M7-2 and M5 (e.g. being NMOS transistors), wherein the gate of the third current source transistor M7-1 is connected to a vertical second select line SAE and the gate of the second current source transistor M6 is connected to the bit line BL.

The output of the first inverter pair (e.g. common node A of the latch circuit) is connected to the complementary bit line BLB via a first select transistor M8 (e.g. a PMOS transistor), wherein the gate of the first select transistor is connected to a vertical third select line SAE. The output of the second inverter pair (e.g. common node B of the latch circuit) is connected to the bit line BL via a second select transistor M9 (e.g. a PMOS transistor), wherein the gate of the second select transistor is connected to a fourth third select line SAE.

The output of the SA circuit is provided by an output stage (e.g. an inverter) connected to the common node A.

The four SAE signals are accordingly routed vertically (like the WL and supply voltage rails of the stack of SRAM cells) and connected to the control circuit 2104 of the top device tier N by the routing layer 2108.

As may be seen from FIG. 9b, in terms of layout, the SA circuit 2102b comprises two circuit halves (divided by line L) comprising identical sets of transistors arranged according to layout rotated by 180° with respect to each other (disregarding the output stage/inverter). In other words, the layout of the transistors of the SA circuit 2102b may be centrally symmetric, i.e. present point symmetry with respect to a geometrical center point of the SA circuit 2102b.

Figure 10A:
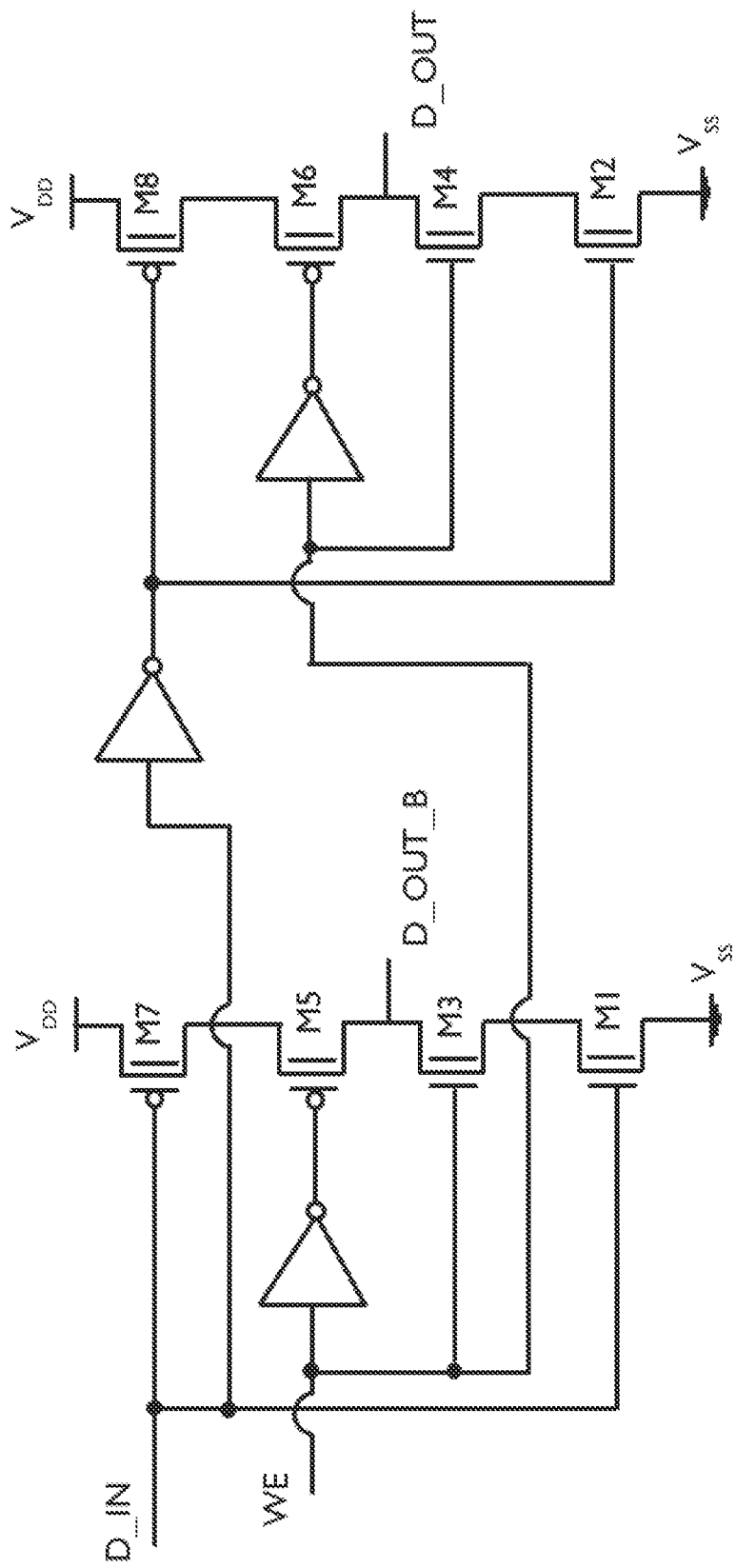
FIGS. 10a and 10b show a circuit schematic of a conventional write driver and a write driver according to an embodiment, respectively.
Figure 10B:
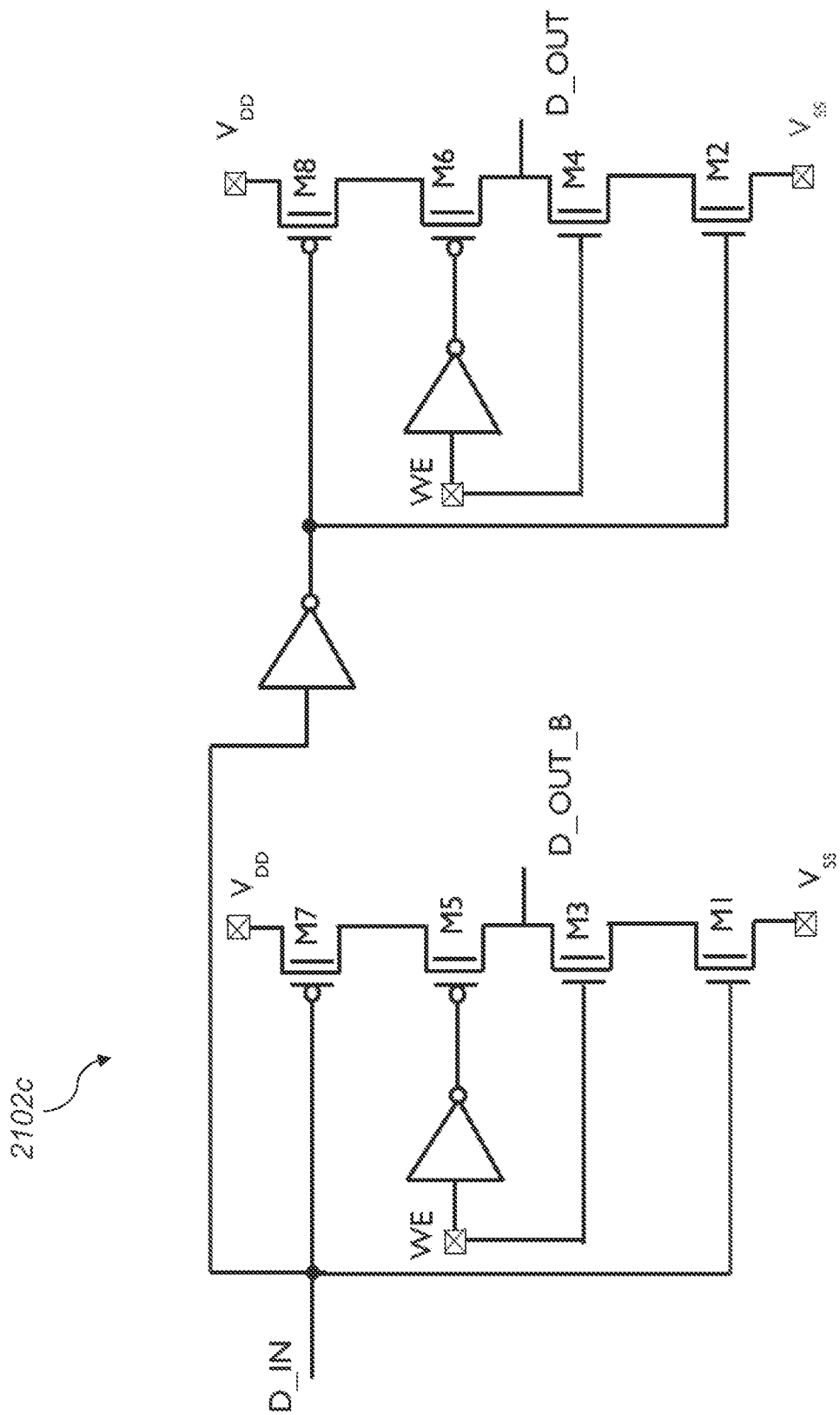

FIG. 10a shows a typical conventional tri-state buffer based write driver circuitry. FIG. 10b shows a modified circuitry without metal crossings. The write driver is enabled by the write enable (WE) signal and drives the bit lines BL, BLB, which are connected to D_OUT and D_OUT_B, to the data input (D_IN). One of the bit lines is discharged through M1 or M2 based on the data input value. As shown in FIG. 10b, the metal crossings may be avoided by providing the WE signal in the third dimension and also duplicating it for the second tri-state input.

While FIGS. 8b, 9b and 10b show illustrative example embodiments of pre-charge, sense amplifier and write driver circuits, respectively. It is to be noted that also other circuit layouts with the equivalent functionality may be used, as long as they are realized using a single routing layer and have identical layout in all device tiers.

With reference again to FIGS. 7a-7c, each of the N device tiers of the 3D IC 2100 further comprises a control circuit 2104. The control circuits 2104 are stacked on top of each other to define a stack of control circuits (control circuit stack). The function of the control circuits 2104 is to allow selective activation of the supplementary circuits 2102 connected to each column of bit cell stacks. Each of the N device tiers of the 3D IC 2100 further comprises a row decoder circuit 2106. The row decoder circuits 2106 are stacked on top of each other to define a stack of row decoder circuits 2106 (row decoder circuit stack).

The stack of control circuits 2104 and the stack of row decoder circuits 2106 are arranged adjacent the SRAM circuit stack 1108. Each of the stack of control circuits 2104 and the stack of row decoder circuits 2106 has a configuration compatible with the Nanofabric design constraints. Accordingly, each circuit (control circuit 2104 or row decoder circuit 2106) of the respective stack forms part of a respective one of the N device tiers of the 3D IC 2100, each having an identical layout and comprises a network of interconnected logic gates, each logic gate comprising a network of interconnected transistors, a single active layer forming an active semiconductor pattern of the transistors of the logic gates of the circuit, and a single routing layer of horizontally routed conductive lines comprising gate lines defining gates of the transistors of the logic gates of the circuit, and wiring lines forming interconnections between the transistors and logic gates of the circuit. The stack of control circuits 2104 and the stack of row decoder circuits 2106 may hence be fabricated in parallel to the SRAM circuit stack 1108 (e.g. using the fabrication flow discussed above) while ensuring that the stacks are formed with matching heights. However, due to the shared configuration of word lines WL of each bit cell stack and of the select signals of each stack of supplementary circuits 2102, only the output of the topmost circuits of the stack of control circuits 2104 and the stack of row decoder circuits 2106 needs to be provided to the SRAM circuit stack 1108.

This is illustrated in FIGS. 7a-7c, wherein it may be seen that only the control circuit 2104 of Tier N is connected to the supplementary circuits 2102 and correspondingly for the row decoder circuit 2106 via a routing layer 2108 stacked on top of the N device tiers (schematically indicated by the lines with crossing fill pattern extending in the X direction and overlying Tier N). More specifically, the routing layer 2108 may connect the outputs WL<0, 1, . . . 255> of the top-most row decoder circuit 2106 to the vertically routed word lines of each of the corresponding rows (e.g. 255) of bit cell stacks of the array 1110. Correspondingly, the routing layer 2108 may connect the outputs of the top-most control circuit 2104 to the vertically routed select lines SEL of each of the corresponding columns (e.g. 8) of the stacks of supplementary circuits 2102 of the SRAM circuit stack 1108. The control circuits 2104 and row decoder circuits 2106 of the lower device tiers may hence define dummy circuits with outputs not connected to the SRAM circuit 1104 of the matching device tier.

While the schematic depiction in FIGS. 7a-7c shows only a single common horizontal routing line of the routing layer 2108 between the top-most control circuit 2104 and the top-most supplementary circuits 2102, it is contemplated that the routing layer 2108 may provide individual connections for each top-most supplementary circuits 2102 such that the control circuit 2104 may selectively enable any one of the stacks of supplementary circuits 2102. It is envisaged that the top-most control circuit 2104 may have a separate output for each type of supplementary circuit (e.g. precharge circuit, sense amplifier, write driver etc.) and that the routing layer 2104 accordingly may have provide individual connections between each output and each type of supplementary circuit.

It is to be noted that the routing layer 2108 need not obey the no-crossing design rule but may comprise a combination of horizontal conductive paths and vertical vias to realize the connections to the circuits of the top-most device tier. A number of such routing layers may be stacked on top of each other to form a multi-level interconnect structure in the BEOL.

While omitted from FIGS. 7a-7c for illustrative clarity, it is assumed that the 3D IC 2100 may comprise a set of supply rails (e.g. pull-up voltage rails, pull-up voltage rails, VDD, VSS) vertically routed through the respective circuit stacks at selected locations, e.g. through each bit cell stack of the array 1110, each stack of supplementary circuits 2102, the stack of control circuits 2104 and the stack of row decoder circuits 2106.

In use of the 3D IC 2100, the (top-most) control circuit 2104 and row decoder circuit 2106 may together select one of the bit cell stacks from the array 1110 (e.g. of size 256×8) to read-out from or write-into.

To facilitate individual addressing (e.g. for read or write) of a bit cell of a selected bit cell stack, the 3D IC 2100 may make use of a staircase structure, as discussed in [1]. A staircase may, similar to the staircase-like structures used in 3D NAND chips, allow input signals to be provided individually to and from the bit cells of the different device tiers. An input staircase structure may comprise N input tiers, one tier for each of the N device tiers of the 3D IC 2100. Each input tier may form a respective step of the input staircase structure 120, wherein each input tier j may protrude laterally (parallel to the XY-plane) outside each higher-level input tier k, where $1 \leq j \leq N-1$ and $j+1 \leq k \leq N$. Each input tier may comprise a respective set of horizontally extending input wires connected to primary inputs SRAM circuit 1104 of the respective device tier. An input tier may for instance be connected to the supplementary circuits 1102 and/or bit lines BL, BLB of the SRAM circuit 1104 of the respective device tier. Respective (primary) input signals for each device tier may be supplied via a respective set of vertically routed input lines provided for each input tier. Each vertically routed input line may be connected to a respective input of the SRAM circuit 1104 of the respective input tier. Each vertical input contact may be formed by a via extending from the routing layer 2108 to connect (e.g. by landing on) a respective input wire.

While reference here has been made to an input staircase structure, it is noted that individual output from the bit cells of a bit cell stack may be realized by an output staircase structure with a corresponding configuration.

Aside from be used in general memory applications, the SRAM array architecture discussed herein may advantageously be used to realize L1 cache for vertical processors, where the processor is laid out vertically in stacked layers. One example is the Single Instruction Multiple Data (SIMD) processor comprising a one-bit arithmetic logical unit (ALU) at each vertical tier. With reference to FIGS. 7a-7c, each device tier N of the 3D IC 2100 may accordingly comprise a respective one-bit ALU having an output connected to each column of bit cells (e.g. via BL and BLB) of the SRAM circuit 1104 of the respective device tier. The ALUs of the respective device tiers may be individually addressed e.g. using an input staircase structure as discussed above.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A 3D integrated circuit, 3D IC, comprising:
a plurality of vertically stacked device tiers, each device tier comprising an SRAM circuit, each SRAM circuit comprising an SRAM bit cell, wherein the bit cells are stacked on top of each other to define a stack of bit cells and wherein each bit cell comprises first and second pass transistors, first pull-up and pull-down transistors, and second pull-up and pull-down transistors,
wherein the SRAM circuits have an identical layout and each SRAM circuit comprises:
a single active layer forming an active semiconductor pattern of the transistors of the bit cell, and
a single routing layer of horizontally routed conductive lines comprising a complementary pair of first and second bit lines connected to the bit cell of the SRAM circuit, gate lines defining gates of the transistors of the bit cell of the SRAM circuit, and wiring lines forming interconnections of the bit cell of the SRAM circuit;
the 3D IC further comprising:
pull-up and pull-down voltage rails routed vertically through the stack of bit cells and connected to each bit cell of the stack; and
first and second word lines routed vertically through the stack of bit cells and connected to each bit cell of the stack of bit cells.

2. The 3D IC of claim 1, wherein each SRAM circuit comprises an array of SRAM bit cells arranged in a number of rows and a number of columns, wherein the arrays of bit cells are stacked on top of each other to define an array of stacks of bit cells of the 3D IC,
wherein the single routing layer of each SRAM circuit comprises, for each column of bit cells of the array of bit cells of the SRAM circuit, a complementary pair of first and second bit lines connected to each bit cell of the column of bit cells, and, for each bit cell of the array of bit cells, gates of transistors of the bit cell, and wiring lines forming interconnections of the bit cell,
the 3D IC further comprising, for each stack of bit cells of the array of stacks of bit cells, pull-up and pull-down voltage rails and first and second word lines routed vertically through the stack of bit cells and connected to each bit cell of the stack of bit cells.

3. The 3D IC of claim 2, wherein each SRAM circuit further comprises, for each column of bit cells of the array of bit cells of the SRAM circuit, a respective supplementary circuit connected to the pair of first and second bit lines connected to the column of bit cells, wherein each respective supplementary circuit comprises at least one of a pre-charge circuit, a sense amplifier, a write driver and a data latch, and
wherein the supplementary circuits of the SRAM circuits are stacked on top of each other to define a stack of supplementary circuits for each column of stacks of bit cells, and
the 3D IC further comprising, for each stack of supplementary circuits, a set of supply voltage rails and select lines routed vertically through the stack of supplementary circuits and connected to each supplementary circuit of the stack of supplementary circuits.

4. The 3D IC of claim 3, wherein each device tier further comprises a control circuit, wherein the control circuits are stacked on top of each other to define a stack of control circuits, and wherein each control circuit comprises a network of interconnected logic gates for providing select signals, each logic gate comprising a network of interconnected transistors,
wherein the control circuits have an identical layout and each control circuit comprises:
a single active layer forming an active semiconductor pattern of the transistors of the logic gates of the control circuit, and
a single routing layer of horizontally routed conductive lines comprising gate lines defining gates of the transistors of the logic gates of the control circuit, and wiring lines forming interconnections between the transistors and logic gates of the control circuit; and
the 3D IC further comprising:
a routing layer stacked on top of the device tiers comprising the SRAM circuits and the control circuits and configured to connect a top-most control circuit of the stack of control circuits to the select lines routed through the stacks of supplementary circuits.

5. The 3D IC of claim 3, wherein the stack of supplementary circuits for each column of stacks of bit cells comprises a stack of sense amplifier circuits, wherein each sense amplifier circuit is connected to the pair of first and second bit lines connected to a respective column of bit cells, and
wherein the 3D IC comprises, for each stack of sense amplifier circuits, first through fourth select lines, first and second pull-up voltage rails and first and second pull-down voltage rails, each routed vertically through the stack of sense amplifier circuits and connected to each sense amplifier circuit of the stack of sense amplifier circuits.

6. The 3D IC of claim 5, wherein each device tier further comprises a control circuit, wherein the control circuits are stacked on top of each other to define a stack of control circuits, and wherein each control circuit comprises a network of interconnected logic gates for providing select signals, each logic gate comprising a network of interconnected transistors,
wherein the control circuits have an identical layout and each control circuit comprises:
a single active layer forming an active semiconductor pattern of the transistors of the logic gates of the control circuit, and
a single routing layer of horizontally routed conductive lines comprising gate lines defining gates of the transistors of the logic gates of the control circuit, and wiring lines forming interconnections between the transistors and logic gates of the control circuit; and
the 3D IC further comprising:
a routing layer stacked on top of the device tiers comprising the SRAM circuits and the control circuits and configured to connect a top-most control circuit of the stack of control circuits to the select lines routed through the stacks of supplementary circuits.

7. The 3D IC of claim 6, wherein each device tier further comprises a decoder circuit, wherein the decoder circuits are stacked on top of each other to define a stack of decoder circuits, and wherein each decoder circuit comprises a network of interconnected logic gates for providing select signals, each logic gate comprising a network of interconnected transistors,
wherein the decoder circuits have an identical layout and each decoder circuit comprises:

a single active layer forming an active semiconductor pattern of the transistors of the logic gates of the control circuit, and a single routing layer of horizontally routed conductive lines comprising gate lines defining gates of the transistors of the logic gates of the control circuit, and wiring lines forming interconnections between the transistors and logic gates of the control circuit; and the 3D IC further comprising:

a routing layer stacked on top of the device tiers comprising the SRAM circuits and the control circuits and configured to connect a top-most decoder circuit of the stack of decoder circuits to the word lines routed through the array of stacks of bit cells.

8. The 3D IC of claim 7, further comprising a routing layer stacked on top of the device tiers comprising the SRAM circuits, the routing layer comprising horizontally routed supply voltage rails connected to the pull-up and pull-down voltage rails vertically routed through the stacks of bit cells and the supply voltage rails vertically routed through the stacks of supplementary circuits.

9. The 3D IC of claim 7, wherein the routing layer comprises a number of horizontally routed word lines matching a number of columns of stacks of bit cells of the array, and wherein each word line is connected to the word lines of the stacks of bit cells arranged along a same column.

10. The 3D IC of claim 7, further comprising a routing layer stacked on top of the device tiers comprising the SRAM circuits, the routing layer comprising horizontally routed supply voltage rails connected to the pull-up and pull-down voltage rails vertically routed through the stacks of bit cells and the supply voltage rails vertically routed through the stacks of supplementary circuits.

11. The 3D IC of claim 10, wherein the first pull-down transistor and the second pull-down transistor of each bit cell of the stack are connected to a same pull-down voltage rail and a first pull-up transistor and a second pull-up transistor of each bit cell of the stack are connected to a same pull-up voltage rail.

12. The 3D IC of claim 11, wherein the single routing layer comprises first and second gate lines extending in parallel in a horizontal first cell direction and spaced apart in a horizontal second cell direction transverse to the first cell direction, the first gate line overlapping respective channel regions of the first pull-down and pull-up transistors, and the second gate line overlapping respective channel regions of the second pull-down and pull-up transistors, wherein the pull-down voltage rail is connected to respective first source/drain regions of the first and second pull-down transistors located between the first and second gate lines, and wherein the pull-up voltage rail is connected to respective first source/drain regions of the first and second pull-up transistors located between the first and second gate lines.

13. The 3D IC of claim 12, wherein the single routing layer comprises first and second wiring lines parallel to and arranged between the first and second gate lines, wherein the pull-down voltage rail is connected to the respective first source/drain regions of the first and second pull-down transistors by the first wiring line, and wherein the pull-up voltage rail is connected to the respective first source/drain regions of the first and second pull-up transistors by the second wiring line.

14. The 3D IC of claim 13, wherein the first and second pull-down transistors are arranged directly opposite each other along the first wiring line, and the first and second pull-up transistors are arranged directly opposite each other along the second wiring line.

15. The 3D IC of claim 14, wherein the single routing layer of each bit cell further comprises:

a third wiring line parallel to the first gate line and interconnecting respective second source/drain portions of the first pull-down and pull-up transistors, a fourth wiring line extending in the second cell direction and interconnecting the third wiring line and the second gate line, a fifth wiring line parallel to the second gate line and interconnecting respective second source/drain portions of the second pull-down and pull-up transistors, and a sixth wiring line extending in the second cell direction and interconnecting the fifth wiring line and the first gate line.

16. The 3D IC of claim 15, wherein the first gate line extends in the first cell direction between a first end portion and a second end portion, and the second gate line extends in the first cell direction between a first end portion and a second end portion, and wherein the fourth wiring line extends between the third wiring line and the second end portion of the second gate line, past and at a distance from the second end portion of the first gate line, and the sixth wiring line extends between the fifth wiring line and the first end portion of the first gate line, past and at a distance from the first end portion of the second gate line.

17. The 3D IC of claim 15, wherein the first and second pass transistors each comprise first and second source/drain regions, and a channel region extending in the first cell direction between the first and second source/drain regions, wherein the first source/drain region of the first pass transistor is connected to the first bit line, and the second source/drain region of the first pass transistor is connected to the fourth wiring line, wherein the first source/drain region of the second pass transistor is connected to the second bit line, and the second source/drain region of the second pass transistor is connected to the sixth wiring line, and wherein the single routing layer further comprises third and fourth gate lines extending in the second cell direction, the third gate line overlapping the channel region of the first pass transistor, and the fourth gate line overlapping the channel region of the second pass transistor.

18. The 3D IC of claim 16, wherein the first and second pass transistors each comprise first and second source/drain regions, and a channel region extending in the first cell direction between the first and second source/drain regions, wherein the first source/drain region of the first pass transistor is connected to the first bit line, and the second source/drain region of the first pass transistor is connected to the fourth wiring line, wherein the first source/drain region of the second pass transistor is connected to the second bit line, and the second source/drain region of the second pass transistor is connected to the sixth wiring line, and wherein the single routing layer further comprises third and fourth gate lines extending in the second cell direction, the third gate line overlapping the channel region of the first pass transistor, and the fourth gate line overlapping the channel region of the second pass transistor.

19. The 3D IC of claim 1, wherein the first pull-down transistor and the second pull-down transistor of each bit cell of the stack are connected to a same pull-down voltage rail and a first pull-up transistor and a second pull-up transistor of each bit cell of the stack are connected to a same pull-up voltage rail.

* * * * *